US007009247B2

(12) United States Patent
Darwish

(10) Patent No.: US 7,009,247 B2

(45) Date of Patent: Mar. 7, 2006

(54) TRENCH MIS DEVICE WITH THICK OXIDE LAYER IN BOTTOM OF GATE CONTACT TRENCH

(75) Inventor: Mohamed N. Darwish, Campbell, CA (US)

(73) Assignee: Siliconix Incorporated, Santa Clara, CA (US)

(*) Notice: Subject to any disclaimer, the term of this patent is extended or adjusted under 35 U.S.C. 154(b) by 0 days.

(21) Appl. No.: 10/722,984

(22) Filed: Nov. 25, 2003

(65) Prior Publication Data

US 2004/0166636 A1 Aug. 26, 2004

Related U.S. Application Data

(63) Continuation-in-part of application No. 10/106,812, filed on Mar. 26, 2002, now Pat. No. 6,903,412, which is a continuation-in-part of application No. 09/927,143, filed on Aug. 10, 2001, now Pat. No. 6,849,898, application No. 10/722,984, which is a continuation-in-part of application No. 10/326,311, filed on Dec. 19, 2002, which is a continuation-in-part of application No. 10/317,568, filed on Dec. 12, 2002, now Pat. No. 6,764,906, which is a continuation-in-part of application No. 09/898,652, filed on Jul. 3, 2001, now Pat. No. 6,569,738, said application No. 10/326,311 is a continuation-in-part of application No. 10/176,570, filed on Jun. 21, 2002, now Pat. No. 6,709,930.

(51) Int. Cl.

| | |
|---|---|
| ***H01L 29/76*** | (2006.01) |
| ***H01L 29/94*** | (2006.01) |
| ***H01L 31/062*** | (2006.01) |
| ***H01L 31/113*** | (2006.01) |
| ***H01L 31/119*** | (2006.01) |

(52) U.S. Cl. ...................................... 257/330; 257/331

(58) Field of Classification Search ............... 257/327, 257/330, 331, 332, 333, 334

See application file for complete search history.

(56) References Cited

U.S. PATENT DOCUMENTS

| | | | | |
|---|---|---|---|---|
| 4,546,367 | A | 10/1985 | Schutten et al. | 357/23.4 |
| 4,683,643 | A | 8/1987 | Nakajima et al. | 437/203 |
| 4,914,058 | A | 4/1990 | Blanchard | 437/203 |
| 4,967,245 | A | 10/1990 | Cogan et al. | 357/23.4 |
| 5,424,231 | A | 6/1995 | Yang | 437/40 |
| 5,442,214 | A | 8/1995 | Yang | 257/328 |

(Continued)

FOREIGN PATENT DOCUMENTS

EP 0 801 426 A2 10/1997

(Continued)

OTHER PUBLICATIONS

European Patent Office, Patent Abstracts of Japan, vol. 013, No. 483 (E-839), Nov. 2, 1989 (Hitachi).

(Continued)

*Primary Examiner*—Hoai Pham

(74) *Attorney, Agent, or Firm*—Silicon Valley Patent Group LLP

(57) ABSTRACT

A trench MIS device includes a thick dielectric layer at the bottom of the trench. The thick dielectric layer can be formed by the deposition or thermal growth of a dielectric material, such as silicon dioxide, on the bottom portion of the trench. The thick dielectric layer, which reduces the capacitance between the drain and gate of the device, can be formed in both the active areas of the device, where the switching function is performed, and in the inactive areas where, among other things, contacts are made to the gate electrode.

3 Claims, 33 Drawing Sheets

U.S. PATENT DOCUMENTS

| | | | | |
|---|---|---|---|---|
| 5,473,176 | A | 12/1995 | Kakumoto | 257/192 |
| 5,486,714 | A | 1/1996 | Hong | 257/321 |
| 5,882,971 | A | 3/1999 | Wen | 438/276 |
| 5,915,180 | A | 6/1999 | Hara et al. | 438/270 |
| 5,976,936 | A | 11/1999 | Miyajima | 438/268 |
| 6,020,600 | A | 2/2000 | Miyajima et al. | 257/76 |
| 6,074,909 | A | 6/2000 | Gruening | 438/242 |
| 6,084,264 | A | 7/2000 | Darwish | 257/329 |
| 6,144,054 | A | 11/2000 | Agahi et al. | 257/296 |
| 6,291,298 | B1 | 9/2001 | Williams et al. | 438/270 |
| 6,444,528 | B1 | 9/2002 | Murphy | 438/270 |
| 6,569,783 | B1 | 5/2003 | Darwish | 438/270 |
| 6,852,597 | B1 * | 2/2005 | Park et al. | 438/268 |
| 2001/0026989 | A1 | 10/2001 | Thapar | 438/400 |

FOREIGN PATENT DOCUMENTS

| | | |
|---|---|---|
| EP | 1 014 450 A2 | 6/2000 |
| JP | 1-192174 A | 8/1989 |
| JP | 3-211885 | 9/1991 |
| JP | 6-21468 | 1/1994 |
| JP | 10032331 | 2/1998 |
| JP | 11026758 A | 1/1999 |
| JP | 11-163342 | 6/1999 |
| JP | 2000269487 | 8/2000 |
| WO | WO-98/04004 | 1/1998 |
| WO | WO 00/57481 | 9/2000 |

OTHER PUBLICATIONS

European Patent Office, Patent Abstracts of Japan, vol. 015, No. 486 (E-1143), Dec. 10, 1991 (Matsushita).

European Patent Office, Patent Abstracts of Japan, vol. 1999, No. 11, Sep. 30, 1999 (NEC Corp.).

European Patent Office, Abstract of Japan vol. 1999, No. 4, Apr. 30, 1999 (Fuji Electronic Co. Ltd.).

European Patent Office, Abstract of Japan vol. 2000, No. 12, Jan. 3, 2000, (Toshiba Corp; Kaga Toshiba Electron KK).

European Patent Office, Abstract of Japan, vol. 1998, No. 6, Apr. 30, 1998, (NEC Corp).

European Patent Office, Abstract of Japan vol. 1999, No. 8, Jun. 30, 1999, (Toshiba Corp).

* cited by examiner

TRENCH MIS DEVICE WITH THICK OXIDE LAYER IN BOTTOM OF GATE CONTACT TRENCH

This is a continuation-in-part of application Ser. No. 10/106,812, filed Mar. 26, 2002, now U.S. Pat. No. 6,903,412, which is a continuation-in-part of application Ser. No. 09/927,143, filed Aug. 10, 2001, now U.S. Pat. No. 6,849,898. This is also a continuation-in-part of application Ser. No. 10/326,311, filed Dec. 19, 2002, which is a continuation-in-part of the following applications: application Ser. No. 10/317,568, filed Dec. 12, 2002, now U.S. Pat. No. 6,764,906, which is a continuation-in-part of application Ser. No. 09/898,652, filed Jul. 3, 2001, now U.S. Pat. No. 6,569,738; application Ser. No. 10/176,570, filed Jun. 21, 2002, now U.S. Pat. No. 6,709,930; and application Ser. No. 10/106,812, filed Mar. 26, 2002, which is a continuation-in-part of application Ser. No. 09/927,143, filed Aug. 10, 2001, now U.S. Pat. No. 6,849,898. Each of the foregoing applications is incorporated herein by reference in its entirety.

CROSS-REFERENCE TO RELATED APPLICATIONS

This application is related to application Ser. No. 09/927,320, filed Aug. 10, 2001, now U.S. Pat. No. 6,882,000, and to application Ser. No. 09/591,179, filed Jun. 8, 2000, each of which is incorporated herein by reference in its entirety.

FIELD OF THE INVENTION

This invention relates to trench metal-insulator-semiconductor (MIS) devices and in particular to trench MOSFETs that are suitable for high frequency operation.

BACKGROUND

Some metal-insulator-semiconductor (MIS) devices include a gate located in a trench that extends downward from the surface of a semiconductor substrate (e.g., silicon). The current flow in such devices is primarily vertical and, as a result, the cells can be more densely packed. All else being equal, this increases the current carrying capability and reduces the on-resistance of the device. Devices included in the general category of MIS devices include metal-oxide-semiconductor field effect transistors (MOSFETs), insulated gate bipolar transistors (IGBTs), and MOS-gated thyristors.

Trench MOSFETs, for example, can be fabricated with a high transconductance ($g_{m,max}$) and low specific on resistance ($R_{on}$), which are important for optimal linear signal amplification and switching. One of the most important issues for high frequency operation, however, is reduction of the MOSFET internal capacitances. The internal capacitances include the gate-to-drain capacitance ($C_{gd}$), which is also called the feedback capacitance ($C_{rss}$), the input capacitance ($C_{iss}$), and the output capacitance ($C_{oss}$).

FIG. 1 is a cross-sectional view of a conventional n-type trench MOSFET 10. In MOSFET 10, an n-type epitaxial ("N-epi") layer 13, which is usually grown on an $N^+$ substrate (not shown), is the drain. N-epi layer 13 may be a lightly doped layer, that is, an $N^-$ layer. A p-type body region 12 separates N-epi layer 13 from $N^+$ source regions 11. Current flows vertically through a channel (denoted by the dashed lines) along the sidewall of a trench 19. The sidewall and bottom of trench 19 are lined with a thin gate insulator 15 (e.g., silicon dioxide). Trench 19 is filled with a conductive material, such as doped polysilicon, which forms a gate 14. Trench 19, including gate 14 therein, is covered with an insulating layer 16, which may be borophosphosilicate glass (BPSG). Electrical contact to source regions 11 and body region 12 is made with a conductive layer 17, which is typically made of a metal or metal alloy. Gate 14 is contacted in the third dimension, outside of the plane of FIG. 1.

A significant disadvantage of MOSFET 10 is a large overlap region 18 formed between gate 14 and N-epi layer 13, which subjects a portion of thin gate insulator 15 to the drain operating voltage. The large overlap limits the drain voltage rating of MOSFET 10, presents long term reliability issues for thin gate insulator 15, and greatly increases the gate-to-drain capacitance, $C_{gd}$, of MOSFET 10. In a trench structure, $C_{gd}$ is larger than in conventional lateral devices, limiting the switching speed of MOSFET 10 and thus its use in high frequency applications.

One possible method to address this disadvantage is described in the above-referenced application Ser. No. 09/591,179 and is illustrated in FIG. 2. FIG. 2 is a cross-sectional view of a trench MOSFET 20 with an undoped polysilicon plug 22 near the bottom of trench 19. MOSFET 20 is similar to MOSFET 10 of FIG. 1, except for polysilicon plug 22, which is isolated from the bottom of trench 19 by oxide layer 21 and from gate 14 by oxide layer 23. The sandwich of oxide layer 21, polysilicon plug 22, and oxide layer 23 serves to increase the distance between gate 14 and N-epi layer 13, thereby decreasing $C_{gd}$.

In some situations, however, it may be preferable to have a material even more insulating than undoped polysilicon in the bottom of trench 19 to minimize $C_{gd}$ for high frequency applications.

One possible method to address this issue is described in the above-referenced application Ser. No. 09/927,320 and is illustrated in FIG. 3. FIG. 3 is a cross-sectional view of a trench MOSFET 30 with a thick insulating layer 31 near the bottom of trench 19. MOSFET 30 is similar to MOSFET 10 of FIG. 1 and MOSFET 20 of FIG. 2. In MOSFET 30, however, only the sidewall of trench 19 is lined with thin gate insulator 15 (e.g., silicon dioxide). Unlike MOSFET 10 of FIG. 1, a thick insulating layer 31 (e.g., silicon dioxide) lines the bottom of trench 19 of MOSFET 30 of FIG. 3. Thick insulating layer 31 separates gate 14 from N-epi layer 13. This circumvents the problems that occur when only thin gate insulator 15 separates gate 14 from N-epi layer 13 (the drain) as in FIG. 1. Thick insulating layer 31 provides a more effective insulator than is achievable with polysilicon plug 22 as shown in FIG. 2. Thick insulating layer 31 decreases the gate-to-drain capacitance, $C_{gd}$, of MOSFET 30 compared to MOSFET 20 of FIG. 2.

The solution of FIG. 3 has a thin gate oxide region 24 between body region 12 and thick insulating layer 31. This is because the bottom interface of body region 12 and the top edge of thick insulating layer 31 are not self-aligned. If body region 12 extends past the top edge of thick insulating layer 31, MOSFET 30 could have a high on-resistance, $R_{on}$, and a high threshold voltage. Since such alignment is difficult to control in manufacturing, sufficient process margin can lead to significant gate-to-drain overlap in thin gate oxide regions 24. Thin gate region 24 also exists in MOSFET 20 of FIG. 2, between body region 12 and polysilicon plug 22. Thus, $C_{gd}$ can still be a problem for high frequency applications. Accordingly, a trench MOSFET with decreased gate-to-drain capacitance, $C_{gd}$, and better high frequency performance is desirable.

SUMMARY

In accordance with the present invention, a metal-insulator-semiconductor (MIS) device includes a semiconductor substrate including a trench extending into the substrate from a surface of the substrate. A source region of a first conductivity type is adjacent to a sidewall of the trench and to the surface of the substrate. A body region of a second conductivity type opposite to the first conductivity type is adjacent to the source region and to the sidewall and to a first portion of a bottom surface of the trench. A drain region of the first conductivity type is adjacent to the body region and to a second portion of the bottom surface of the trench. The trench is lined with a first insulating layer at least along the sidewall that abuts the body region and at least along the first portion of the bottom surface that abuts the body region. The trench is also lined with a second insulating layer along the second portion of the bottom surface of the trench. The second insulating layer is coupled to the first insulating layer, and the second insulating layer is thicker than the first insulating layer.

In an exemplary embodiment of a fabrication process for such an MIS device, a trench including a sidewall, a corner surface, and a central bottom surface is formed in a substrate. A thick insulating layer is deposited on the central bottom surface. A thin insulating layer is formed on the sidewall and on the corner surface. A gate is formed around and above the thick insulating layer and adjacent to the thin insulating layer in the trench, so as to form an active corner region along at least a portion of the corner surface.

In one embodiment, the thick insulating layer is deposited using a mask layer that is deposited and etched to expose a central portion of the bottom surface of the trench. The thick insulating layer is deposited and etched to form an exposed portion of the mask layer on the sidewall, leaving a portion of the thick insulating layer on the central portion of the bottom surface of the trench. The mask layer is removed, exposing the sidewall and the corner surface of the trench, while leaving the portion of the thick insulating layer on the central portion of the bottom surface of the trench.

The thick insulating layer separates the trench gate from the drain conductive region at the bottom of the trench, while the active corner regions minimize the gate-to-drain overlap in thin gate insulator regions. This results in a reduced gate-to-drain capacitance, making MIS devices in accordance with the present invention, such as trench MOSFETs, suitable for high frequency applications.

In an alternative embodiment, the trench is lined with an oxide layer. The oxide layer comprises a first section, a second section and a transition region between said first and second sections. The first section is adjacent at least a portion of the drain region of the device, and the second section is adjacent at least a portion of the body region of the device. The thickness of the oxide layer in said first section is greater than the thickness of said oxide layer in the second section. The thickness of the oxide layer in the transition region decreases gradually from the first section to the second section. A PN junction between the body region and the drain region terminates at the trench adjacent said transition region of said oxide layer.

This embodiment may be fabricated by forming a mask layer on the sides and bottom of the trench, as described above, and etching the mask layer from the central bottom portion of the trench. An oxide layer is then thermally grown where the substrate is exposed in the central bottom portion of the trench. This oxide layer forms a typical "bird's beak" under the mask layer, and removing the mask layer produces a thick oxide layer on the central bottom portion of the trench, The thick oxide layer becomes gradually thinner on each side, in the area of the "bird's beak."

In an alternative fabrication process, a mask layer is deposited and etched, as described above, and then an oxide layer is deposited by a process that causes the oxide to deposit preferentially on the substrate material at the bottom of the trench (typically silicon) as compared with the material of the mask layer.

The principles and processes of this invention can be used both on the trenches in the active area and on the trenches in the inactive areas of the chip, such as those trenches where contact is made between the gate bus and the gate electrode.

BRIEF DESCRIPTION OF THE DRAWINGS

This invention will be better understood by reference to the following description and drawings. In the drawings, like or similar features are typically labeled with the same reference numbers.

DESCRIPTION OF THE INVENTION

Figure 4:
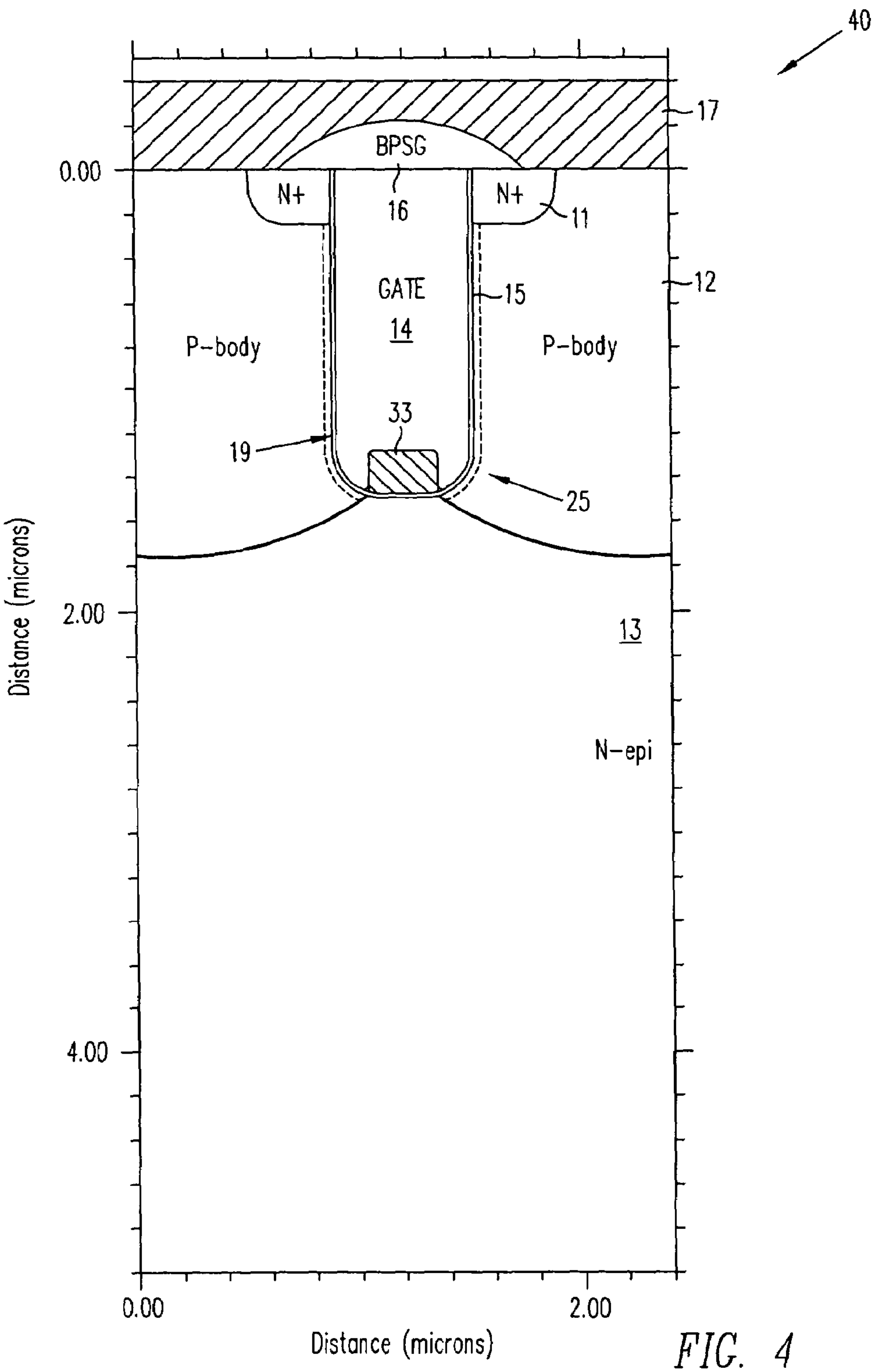
FIG. 4 is a cross-sectional view of one embodiment of a trench MOSFET in accordance with the present invention.

FIG. 4 is a cross-sectional view of one embodiment of a trench MOSFET 40 in accordance with the present invention. In MOSFET 40, an n-type epitaxial ("N-epi") layer 13, which may be an $N^-$ layer and is usually grown on an $N^+$ substrate (not shown), is the drain. A p-type body region 12 separates N-epi layer 13 from $N^+$ source regions 11. Body region 12 is diffused along the sidewall of a trench 19, past a corner region 25, and partially long the bottom of trench 19. Current flows vertically through a channel (denoted by the dashed lines) along the sidewall and around corner region 25 of trench 19.

The sidewall and corner region 25 of trench 19 are lined with a thin gate insulator 15 (e.g., silicon dioxide). An oxide plug 33 is centrally located in the bottom of trench 19. Trench 19 is filled with a conductive material, such as doped polysilicon, which forms a gate 14. Gate 14 extends into corner region 25 of trench 19, between oxide plug 33 and gate insulator 15. Trench 19, including gate 14 and oxide plug 33 therein, is covered with an insulating layer 16, which may be borophosphosilicate glass (BPSG). Electrical contact to source regions 11 and body region 12 is made with source metal layer 17. Gate 14 is contacted in the third dimension, outside of the plane of FIG. 4.

The trench MOSFET of FIG. 4 uses oxide plug 33 to separate gate 14 from N-epi layer 13, thereby decreasing the gate-to-drain capacitance, $C_{gd}$. Having the channel extend around corner region 25 to the bottom of the trench precludes significant gate-to-drain overlap in thin gate oxide regions (i.e., see thin gate oxide regions 24 in FIG. 3) because the diffusion of body region 12 can be very well controlled through corner region 25. Since lateral diffusion is six to ten times slower than vertical diffusion, the pn junction between body region 12 and N-epi layer 13 can be made to coincide with the transition between thin gate insulator 15 and oxide plug 33. Thus, oxide plug 33 and active corner region 25 minimize the gate-to-drain capacitance, $C_{gd}$, with minimum impact on on-resistance, $R_{on}$, yielding a trench MOSFET 40 useful for high frequency applications.

Figure 5A:
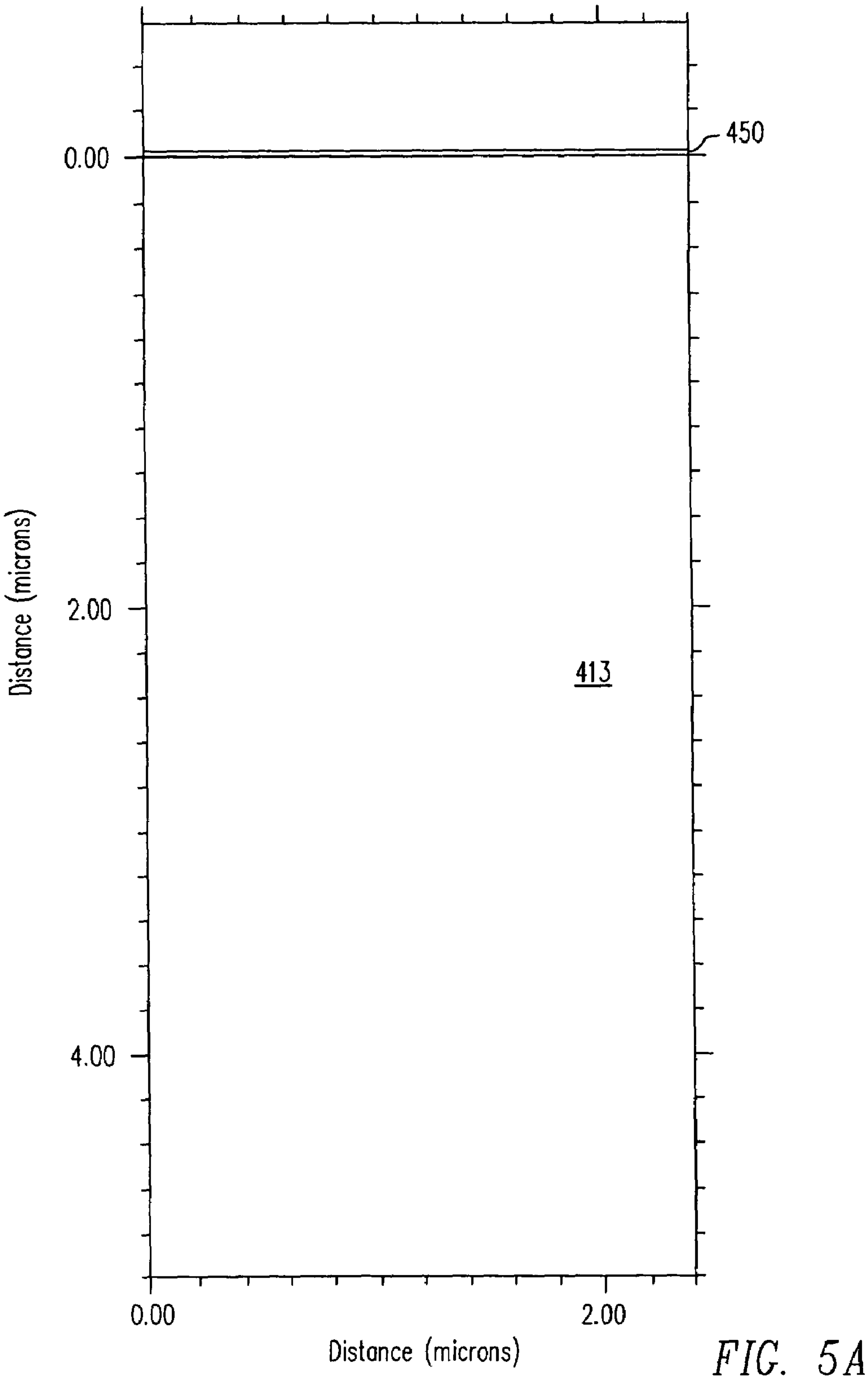
FIGS. 5A–5P are cross-sectional views illustrating one embodiment of a process for fabricating a trench MOSFET in accordance with the present invention.
Figure 5B:
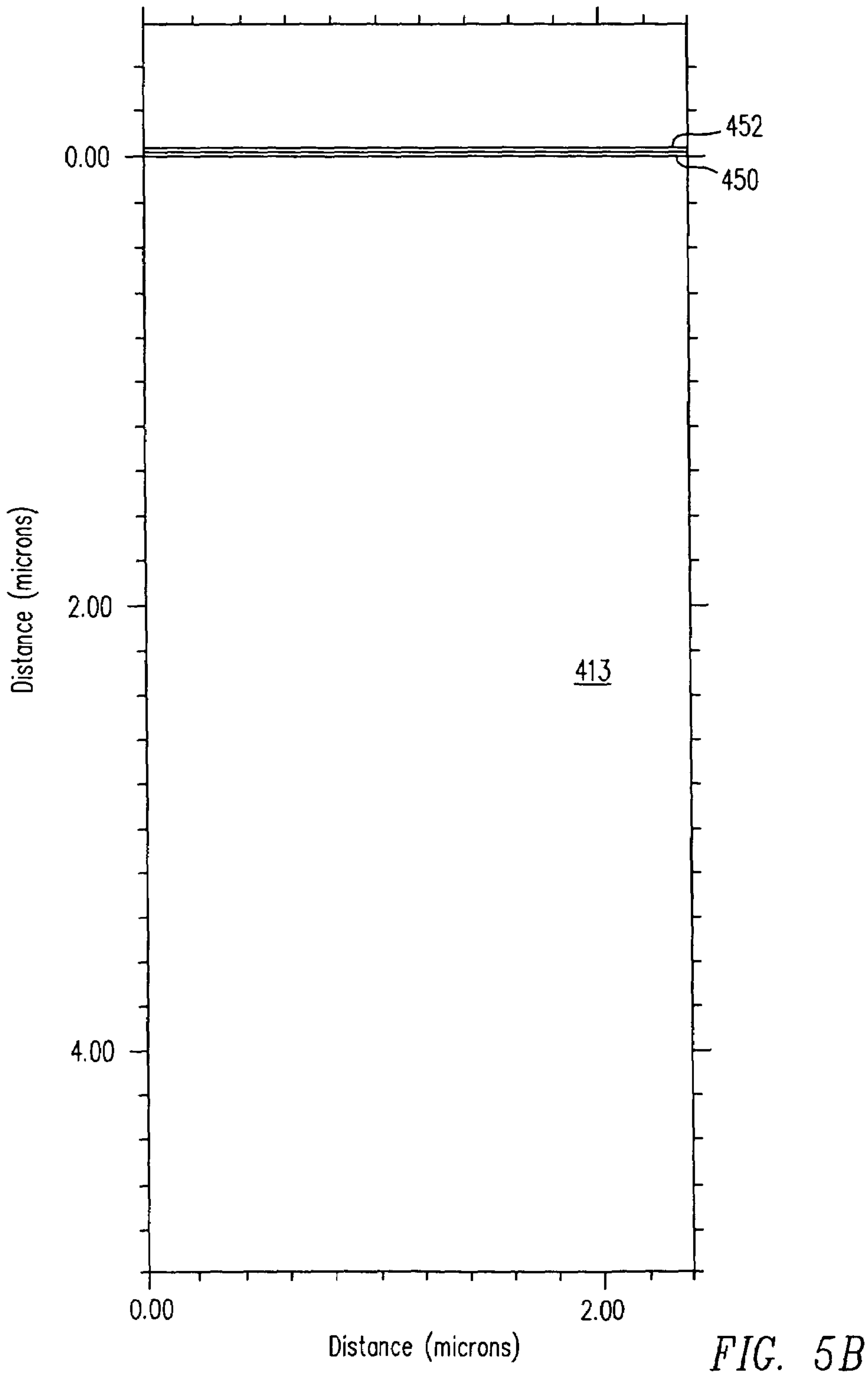
Figure 5C:
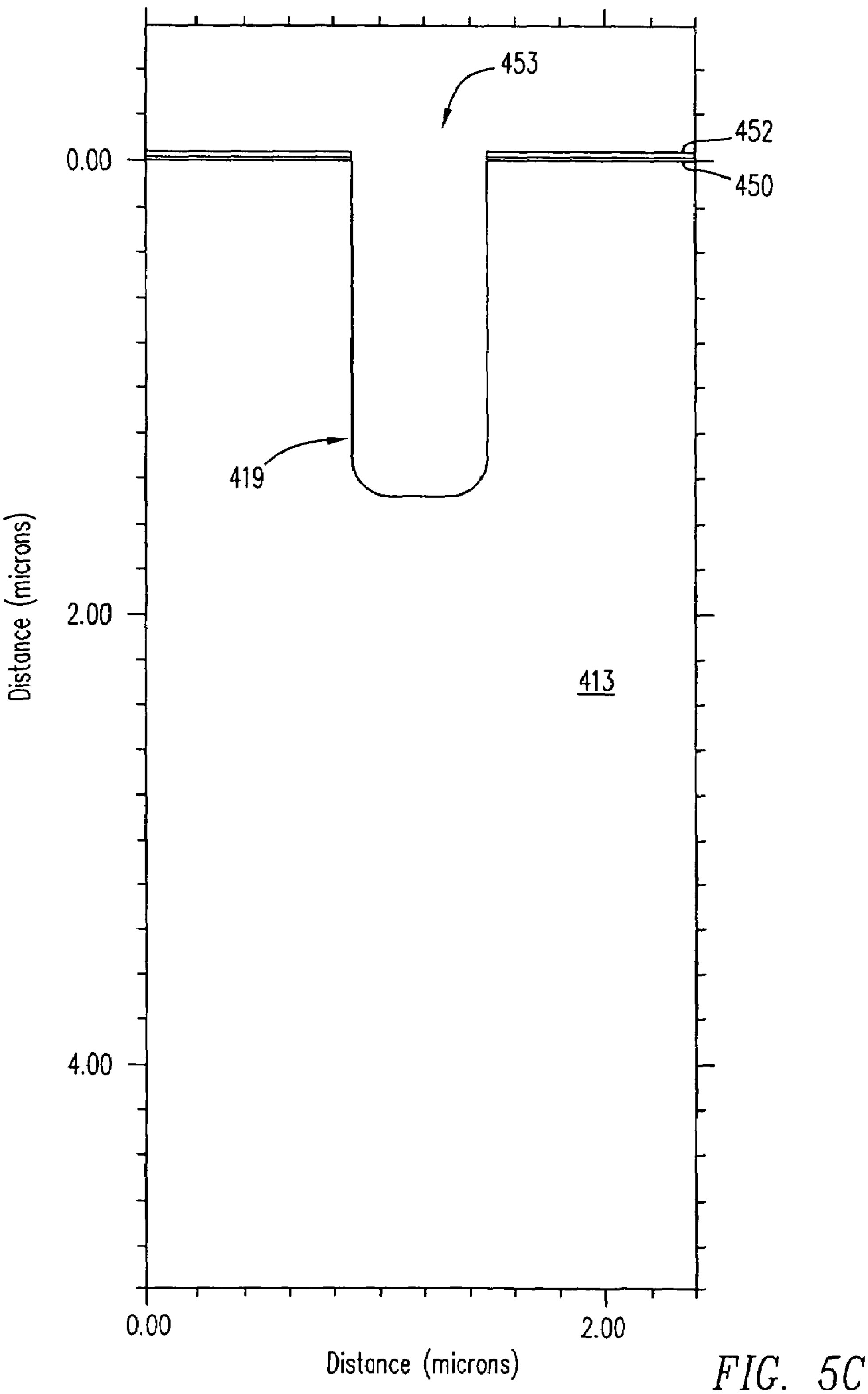
Figure 5D:
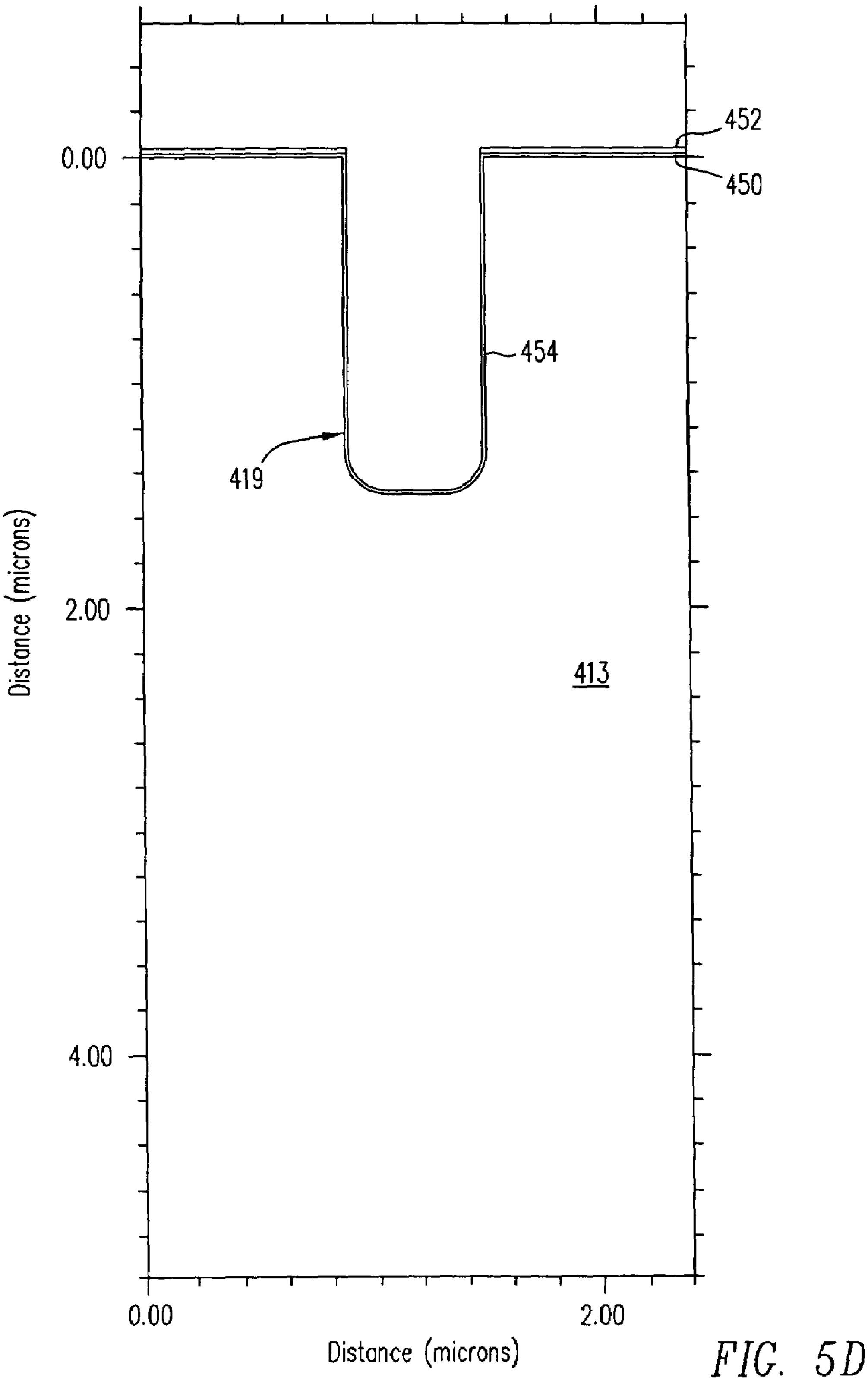
Figure 5E:
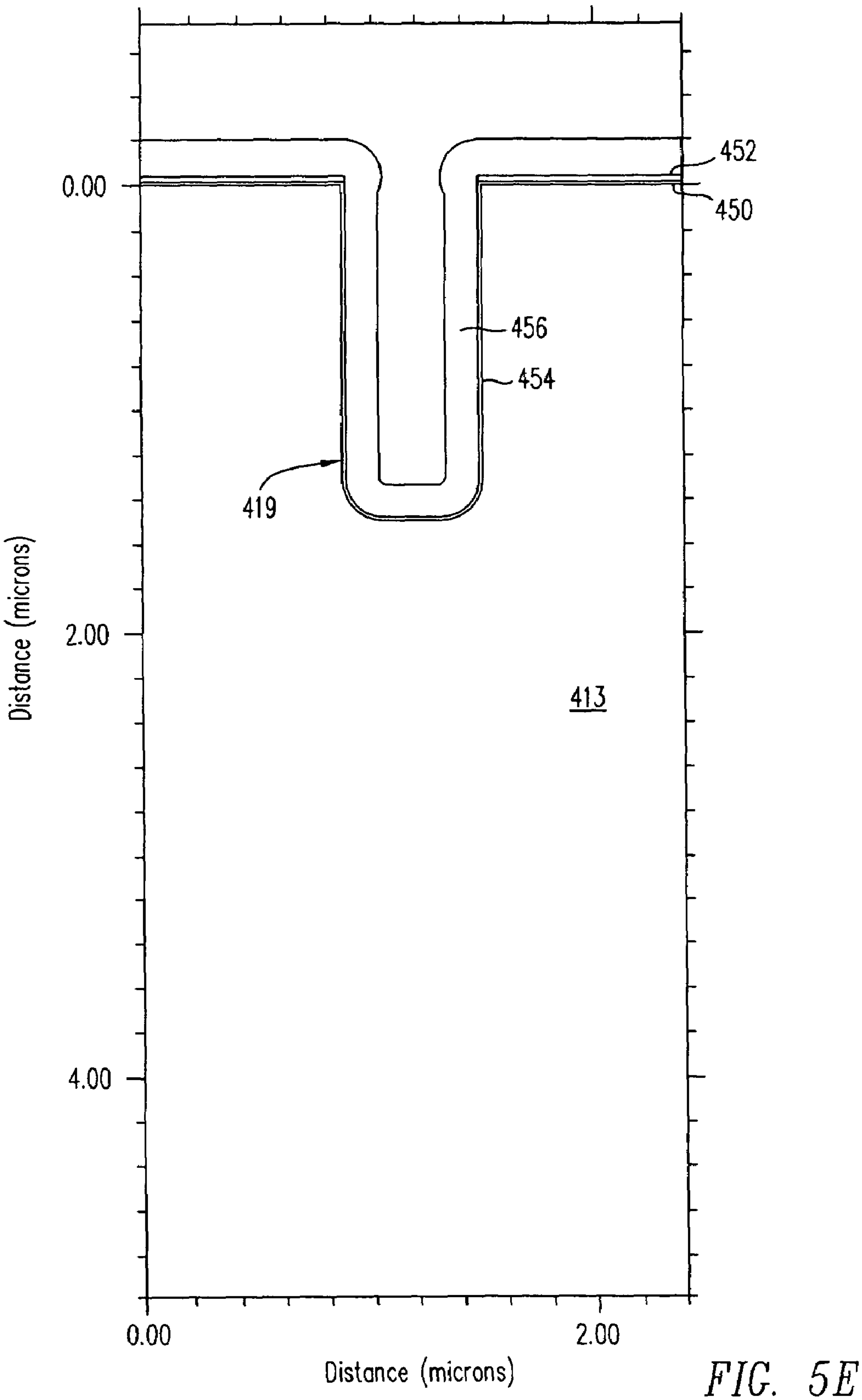
Figure 5F:
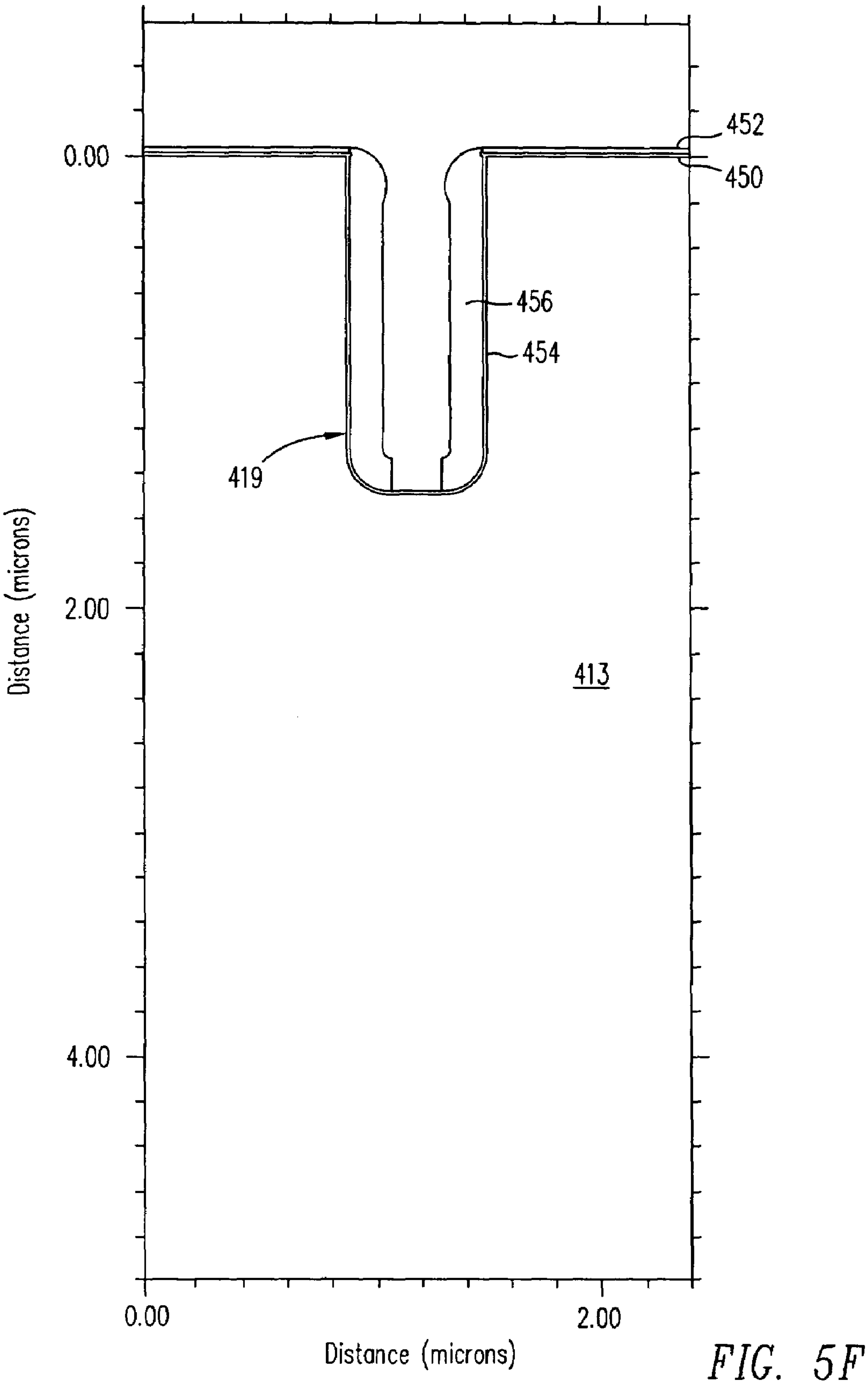
Figure 5G:
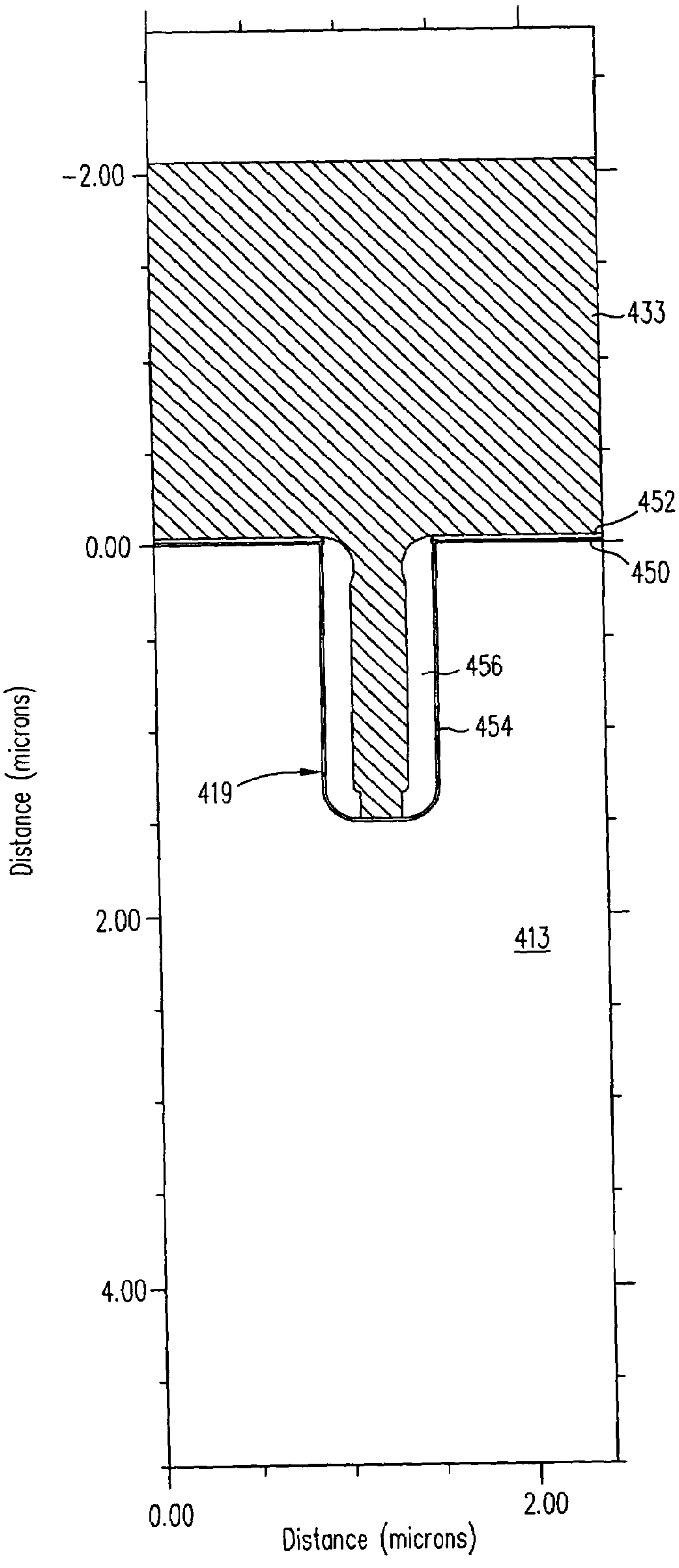
Figure 5H:
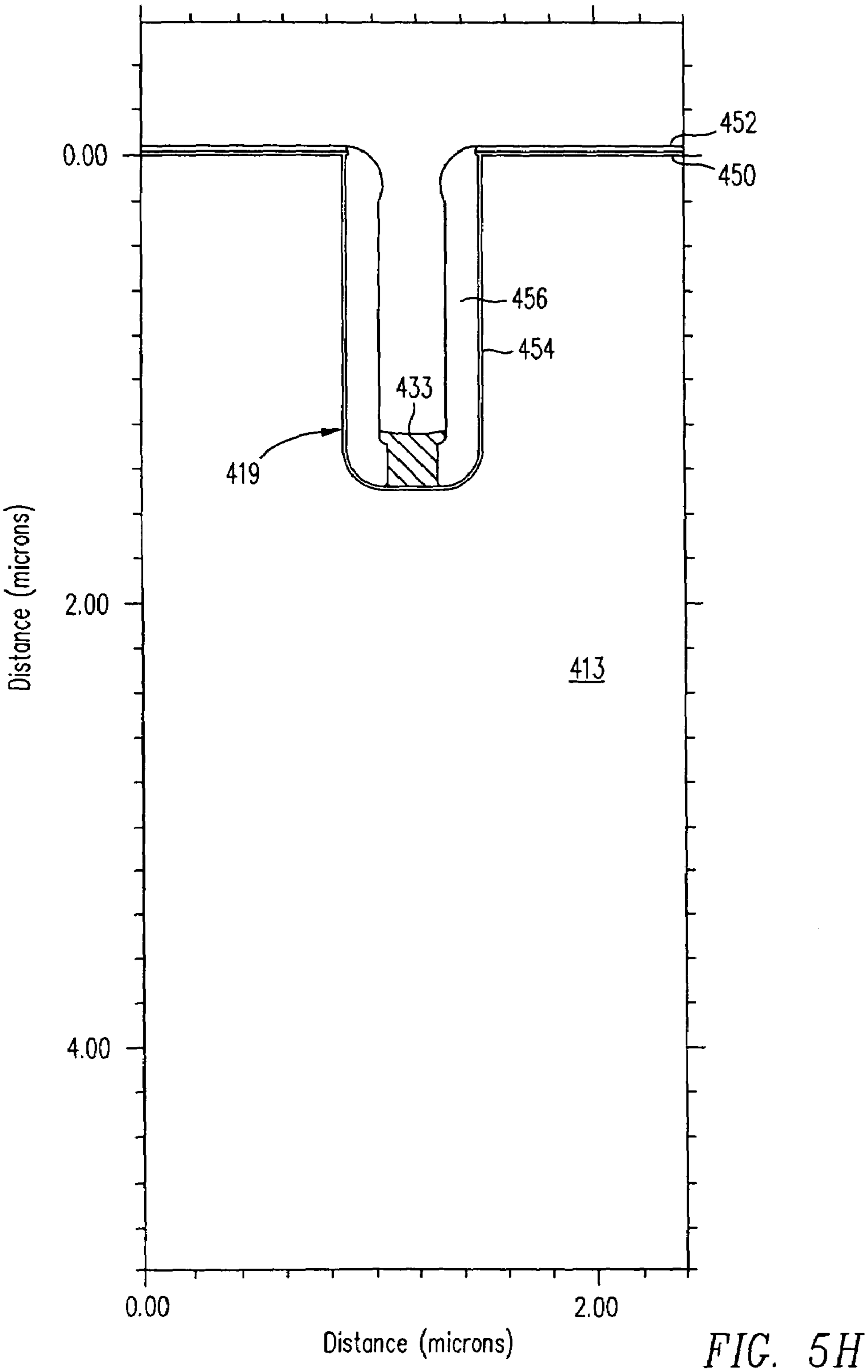
Figure 5I:
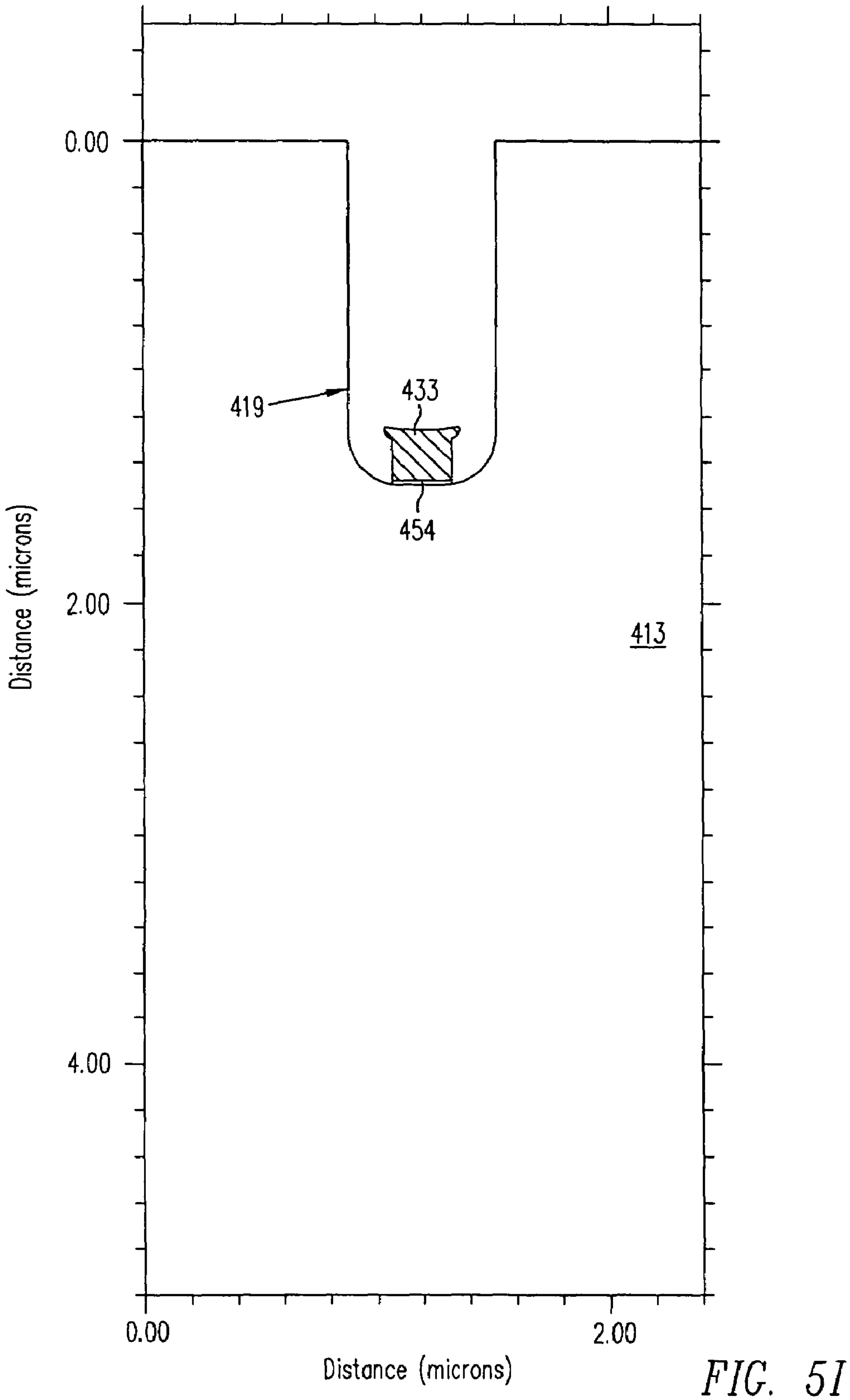
Figure 5J:
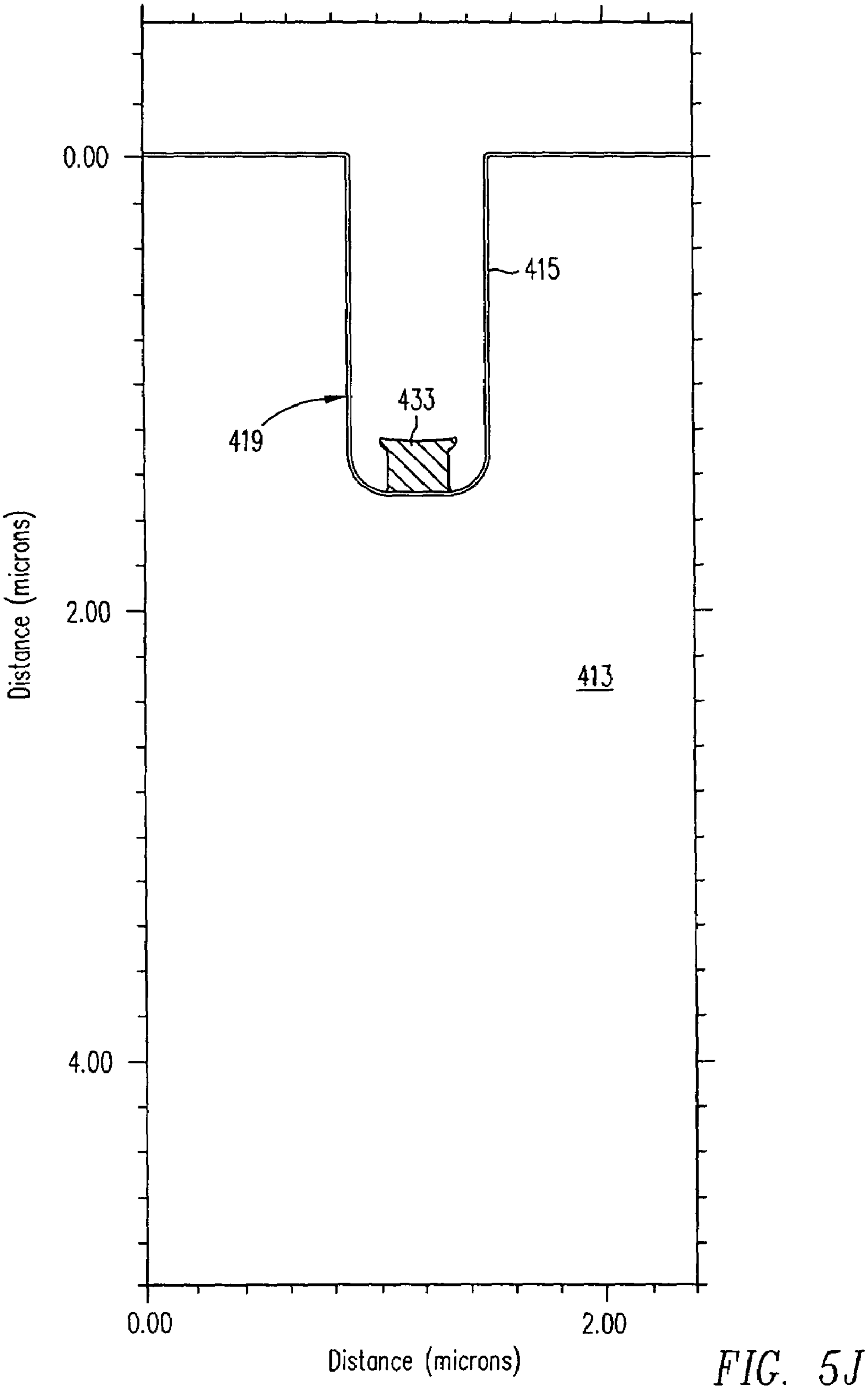
Figure 5K:
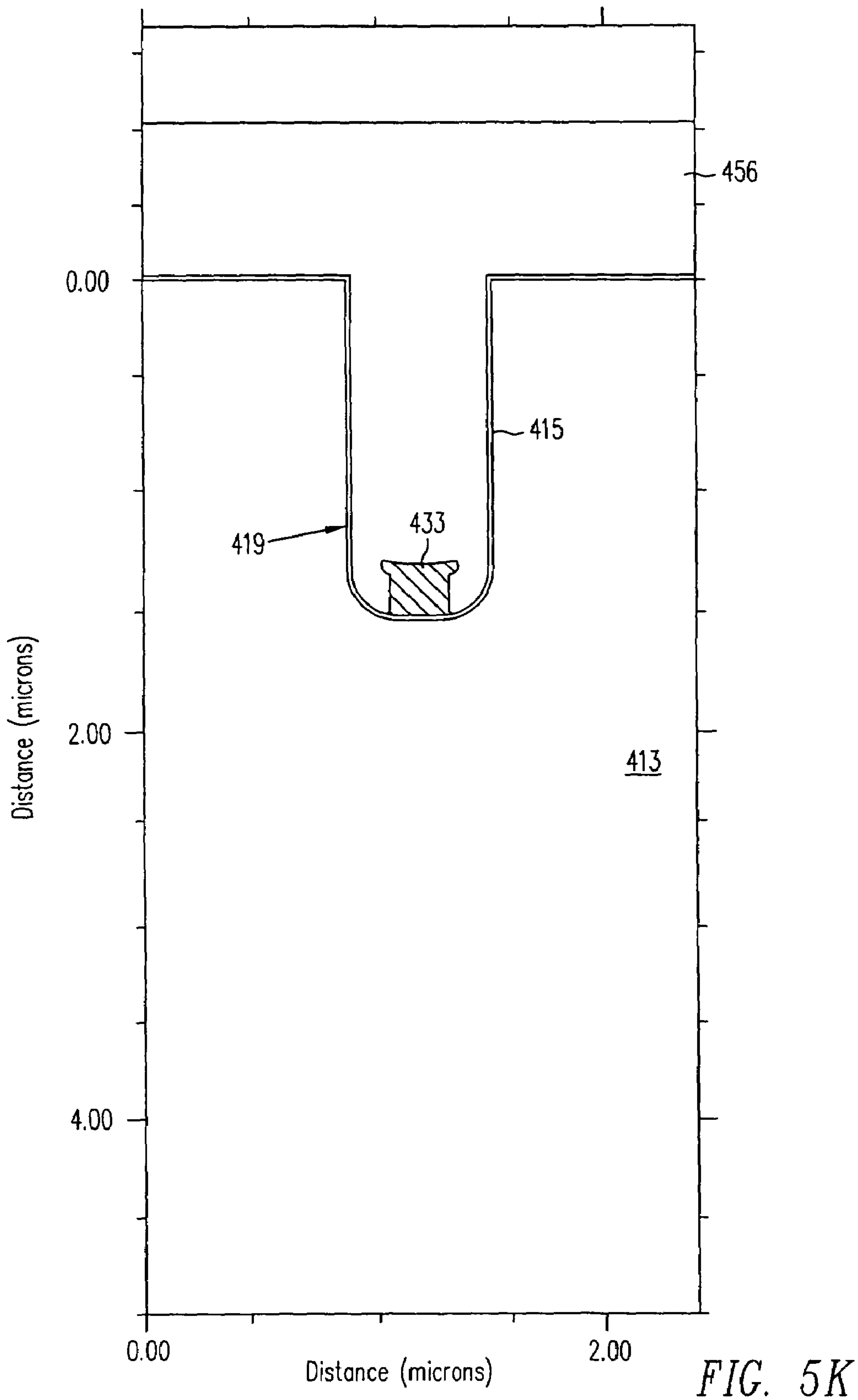
Figure 5L:
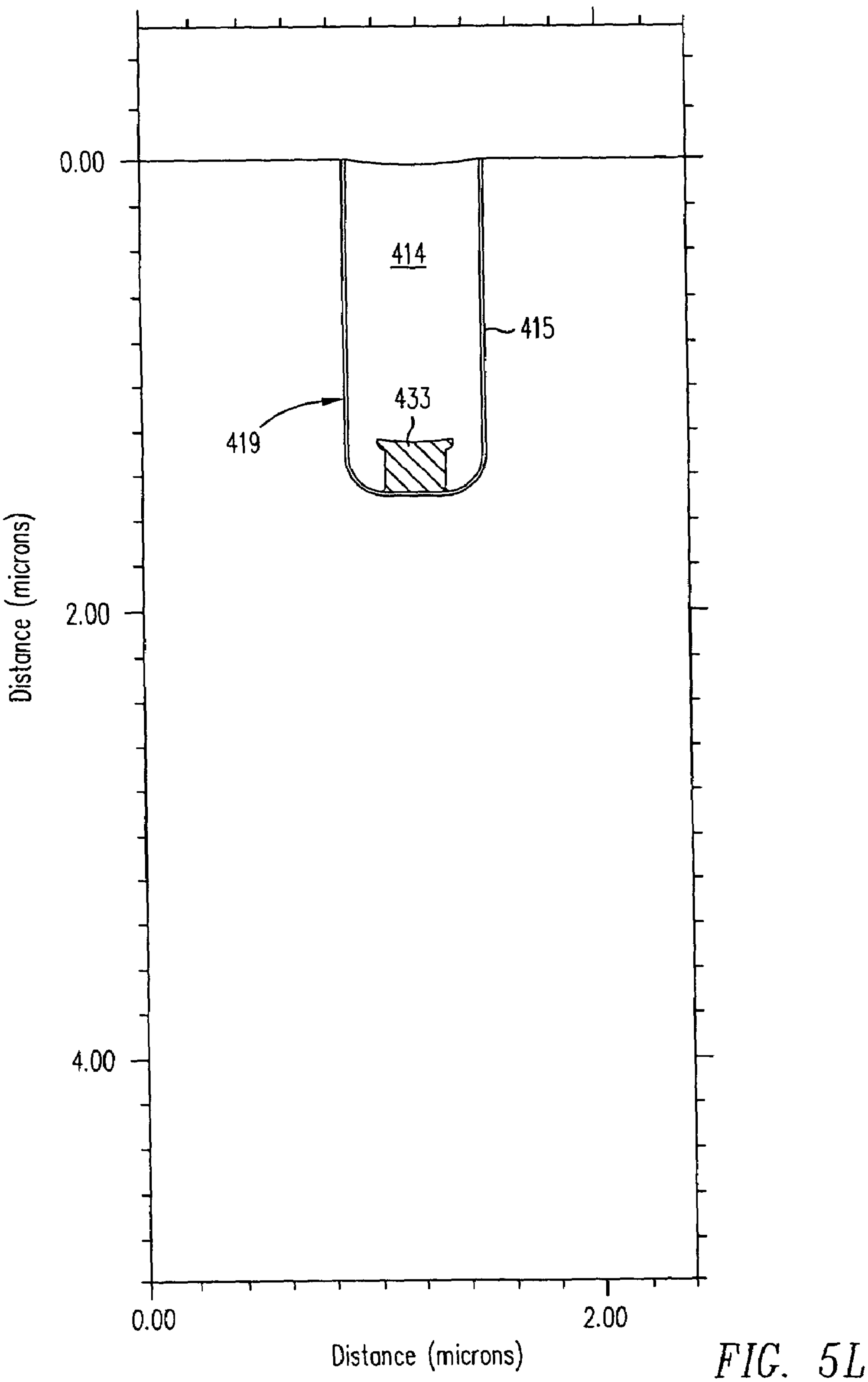
Figure 5M:
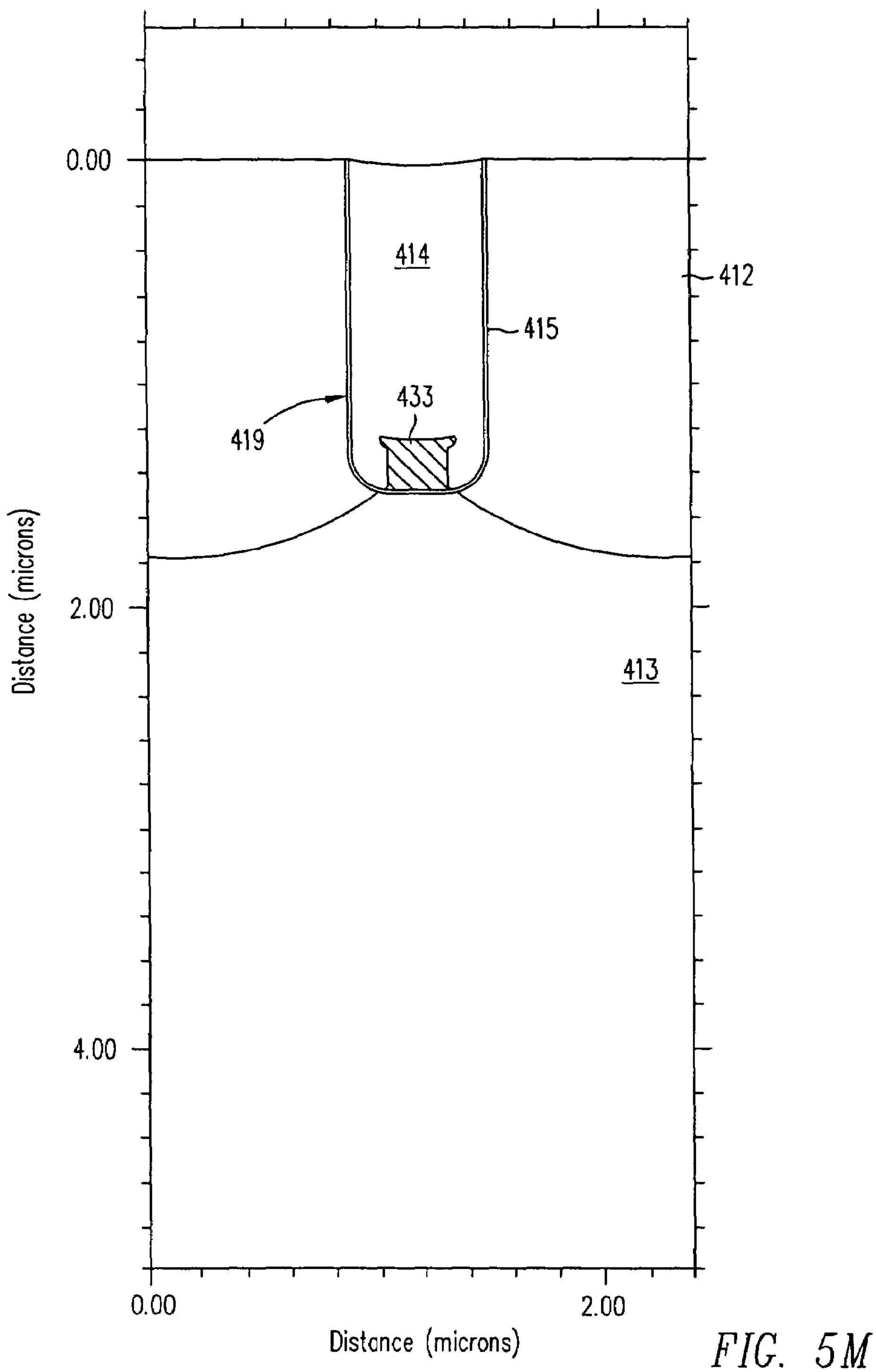
Figure 5N:
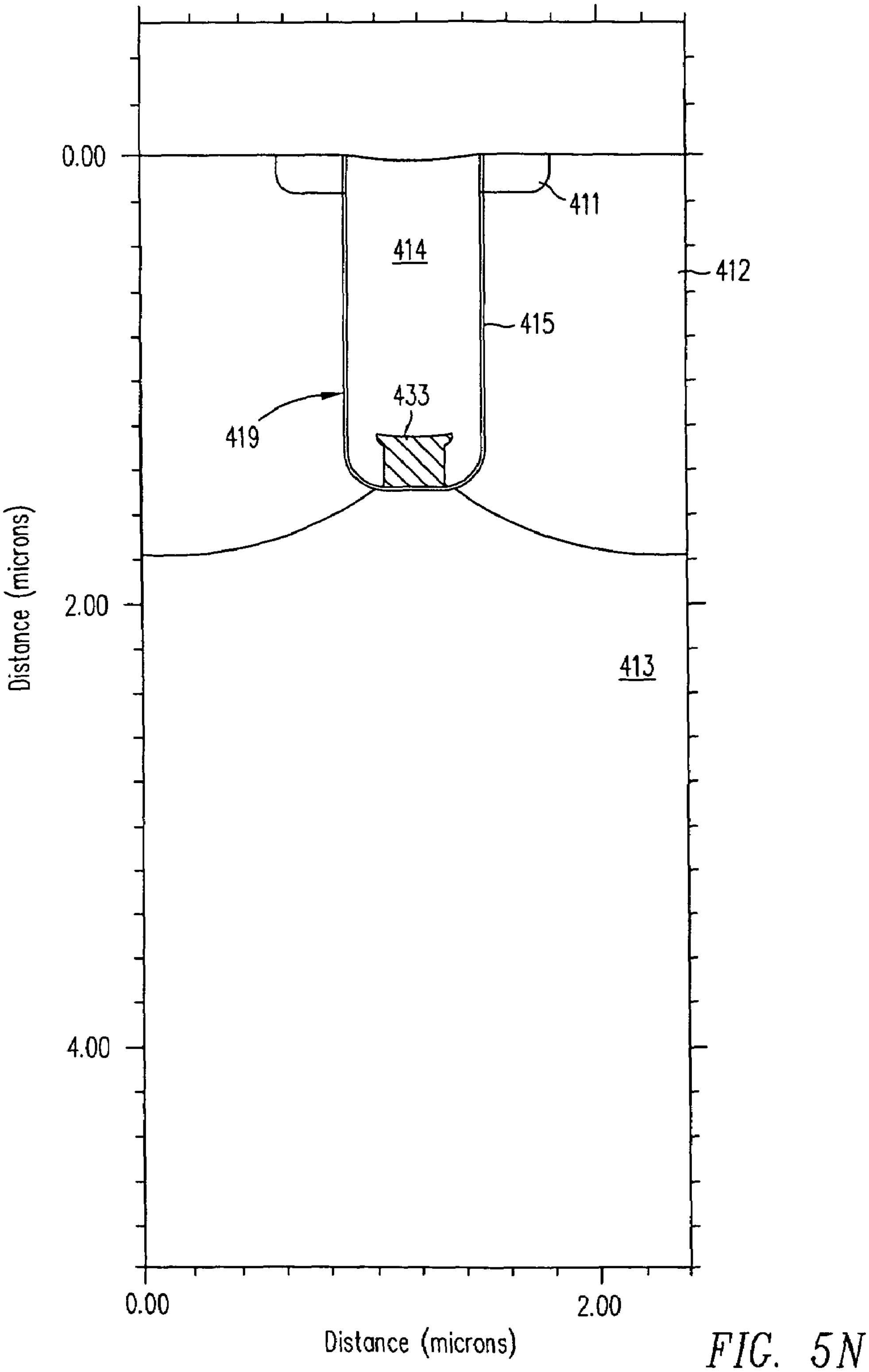
Figure 50:
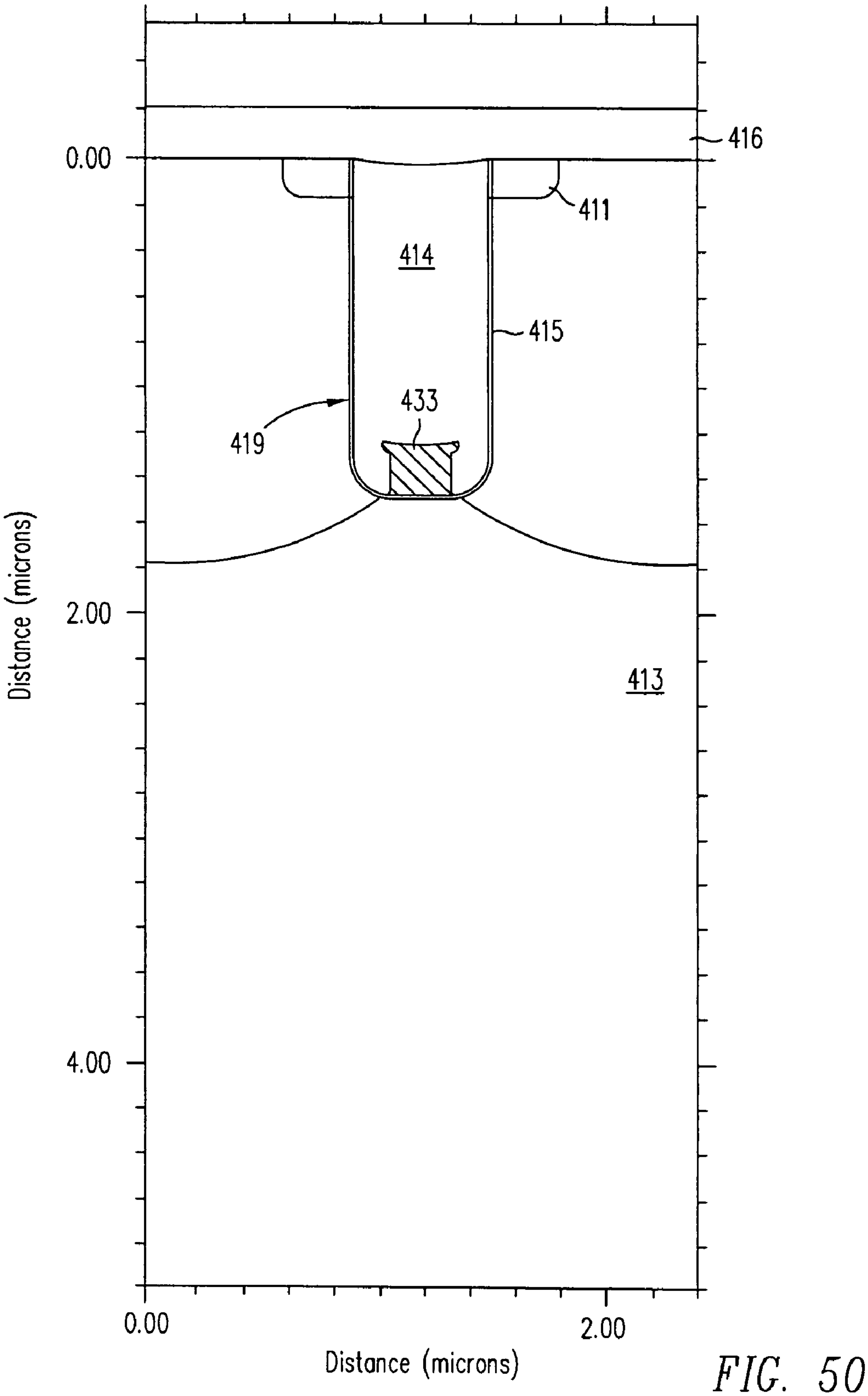
Figure 5P:
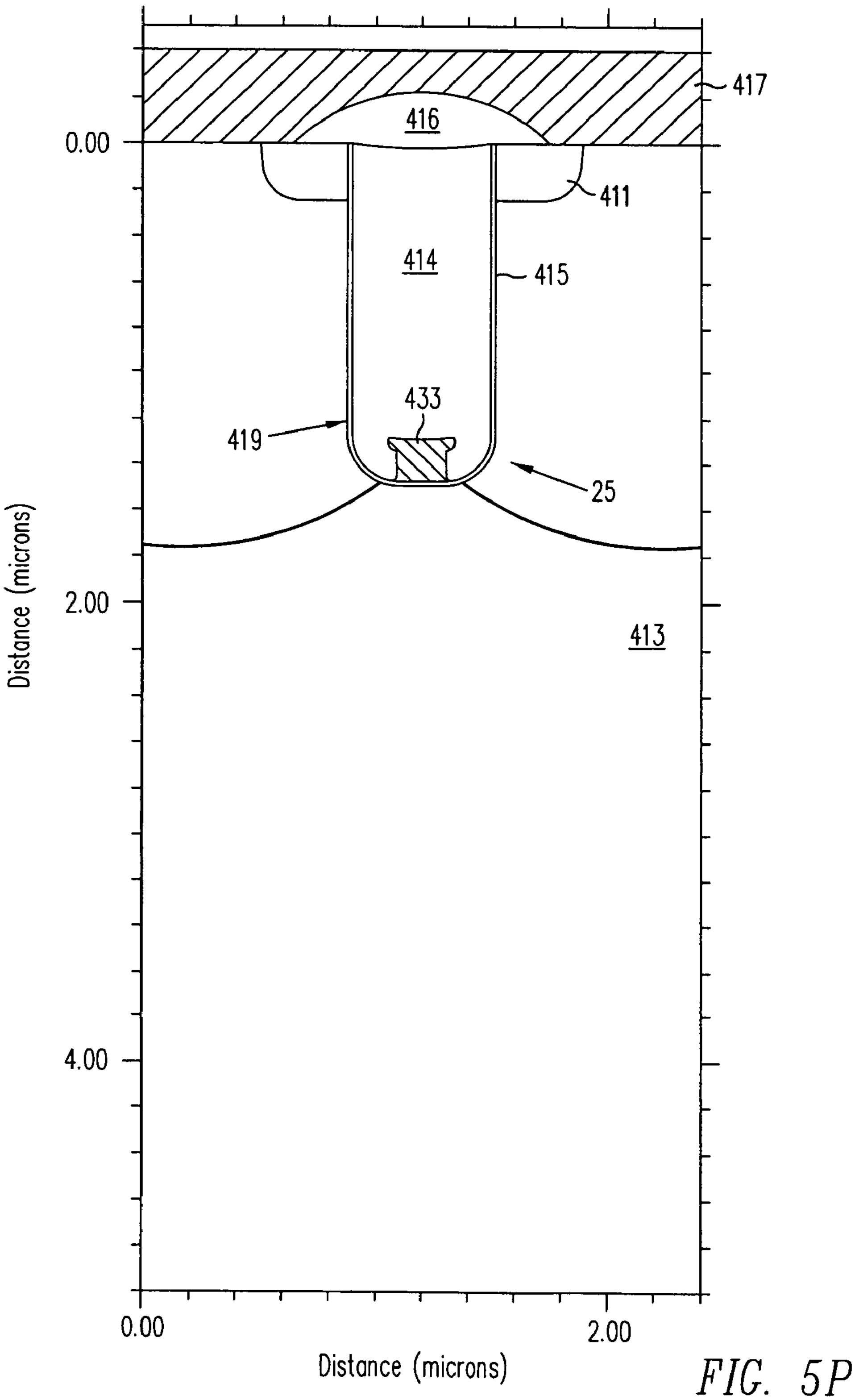

FIGS. 5A-5P are cross-sectional views illustrating one embodiment of a process for fabricating a trench MOSFET, such as MOSFET 40 of FIG. 4, in accordance with the present invention. As shown in FIG. 5A, the process begins with a lightly-doped N-epi layer 413 (typically about 8 $\mu$m thick) grown on a heavily doped $N^+$ substrate (not shown). A pad oxide 450 (e.g., 100–200 Å) is thermally grown by dry oxidation at 950° C. for 10 minutes on N-epi layer 413. As shown in FIG. 5B, a nitride layer 452 (e.g., 200–300 Å) is deposited by chemical vapor deposition (CVD) on pad oxide 450. As shown in FIG. 5C, nitride layer 452 and pad oxide 450 are patterned to form an opening 453 where a trench 419 is to be located. Trench 419 is etched through opening 453, typically using a dry plasma etch, for example, a reactive ion etch (RIE). Trench 419 may be about 0.5–1.2 $\mu$m wide and about 1–2 $\mu$m deep.

A second pad oxide 454 (e.g., 100–200 Å) is thermally grown on the sidewall and bottom of trench 419, as shown in FIG. 5D. A thick nitride layer 456 (e.g., 1000–2000 Å) is deposited conformally by CVD on the sidewall and bottom of trench 419 as well as on top of nitride layer 452, as shown in FIG. 5E. Nitride layer 456 is etched using a directional, dry plasma etch, such as an RIE, using etchants that have high selectivity for nitride layer 456 over pad oxide 450. The nitride etch leaves spacers of nitride layer 456 along the sidewall of trench 419, while exposing pad oxide 454 in the central bottom portion of trench 419, as shown in FIG. 5F. It is possible that nitride layer 456 may be overetched to such a degree that nitride layer 452 is removed from the top of pad oxide 450.

As shown in FIG. 5G, a thick insulating layer 433 (e.g., 2–4 $\mu$m) is then deposited. The deposition process is chosen, according to conventional deposition techniques such as CVD, to be non-conformal, filling trench 419 and overflowing onto the top surface of N-epi layer 413. Thick insulating layer 433 may be, for example, a low temperature oxide (LTO), a phosphosilicate glass (PSG), a BPSG, or another insulating material.

Insulating layer 433 is etched back, typically by performing a wet etch, using an etchant that has high selectivity for insulating layer 433 over nitride layer 456. Insulating layer 433 is etched back into trench 419 until only about 0.1–0.2 $\mu$m remains in trench 419, as shown in FIG. 5H.

Nitride layer 456 is removed, typically by performing a wet etch, using an etchant that has high selectivity for nitride layer 456 over insulating layer 433. Pad oxide 450 is also removed, typically by a wet etch. This wet etch will remove a small, but insignificant portion of insulating layer 433, leaving the structure as shown in FIG. 5I.

In some embodiments, an approximately 500 Å sacrificial gate oxide (not shown) can be thermally grown by dry oxidation at 1050° C. for 20 minutes and removed by a wet etch to clean the sidewall of trench 419. The wet etch of such a sacrificial gate oxide is kept short to minimize etching of insulating layer 433.

As shown in FIG. 5J, a thin gate insulator 415 (e.g., about 300–1000 Å thick) is then formed on the sidewall of trench 419 and the top surface of N-epi layer 413. Thin gate insulator 415 may be, for example, a silicon dioxide layer that is thermally grown using a dry oxidation at 1050° C. for 20 minutes.

As shown in FIG. 5K, a conductive material 456 is deposited by CVD, possibly by low pressure CVD (LPCVD), to fill trench 419 and overflow past the topmost surface of thin gate insulator 415. Conductive material 456 may be, for example, an in-situ doped polysilicon, or an undoped polysilicon layer that is subsequently implanted and annealed, or an alternative conductive material. Conductive material 456 is etched, typically using a reactive ion etch, until the top surface of material 456 is approximately level with the top of N-epi layer 413, thereby forming gate 414, as shown in FIG. 5L. In an n-type MOSFET, gate 414 may be, for example, a polysilicon layer with a doping concentration of $10^{20}$ $cm^{-3}$. In some embodiments, conductive material 456 may be etched past the top of trench 419, thereby recessing gate 414 to minimize the gate-to-source overlap capacitance.

Using known implantation and diffusion processes, P-type body regions 412 are formed in N-epi layer 413 as shown in FIG. 5M. Body regions 412 are diffused such that the PN junctions between p-type body regions 412 and the remainder of N-epi layer 413 are located near the interface between thick insulating layer 433 and thin gate insulator 415. This interface occurs at a location along the bottom of trench 419, where the diffusion of body regions 412 is dominated by lateral diffusion under trench 419 rather than vertical diffusion deeper into N-epi layer 413, making control of the diffusion of body regions 412 easier.

Using known implantation and diffusion processes, $N^+$ source regions 411 are formed in N-epi layer 413 as shown in FIG. 5N.

As shown in FIG. 5O, an insulating layer 416, which may be borophosphosilicate glass (BPSG), is deposited by CVD on the surfaces of N-epi layer 413 and gate 414. Insulating layer 416 is etched, typically using a dry etch, to expose portions of p-type body regions 412 and $N^+$ source regions 411, as shown in FIG. 5P. Electrical contact to body regions 412 and source regions 411 is made with a conductor 417, which is typically a deposited (e.g., by physical vapor deposition) metal or metal alloy. Electrical contact to gate 414 is made in the third dimension, outside of the plane of FIG. 5P. Electrical contact to the drain (not shown) is made to the opposite surface of the $N^+$ substrate (not shown) on which N-epi layer 413 is grown.

This method thus allows incorporation of thick insulating layer 433, centrally positioned at the bottom of trench 419, to decrease $C_{gd}$ with minimal undesirable effects or manufacturing concerns. For example, stress effects from growing a thick oxide in the concave bottom of trench 419 are avoided by depositing the oxide rather than thermally growing it. In addition, by keeping corner region 25 active (i.e., part of the MOSFET channel), the gate-to-drain overlap in thin gate oxide regions 24 of MOSFET 30 (see FIG. 3) are avoided. This minimizes $C_{gd}$.

Figure 6:
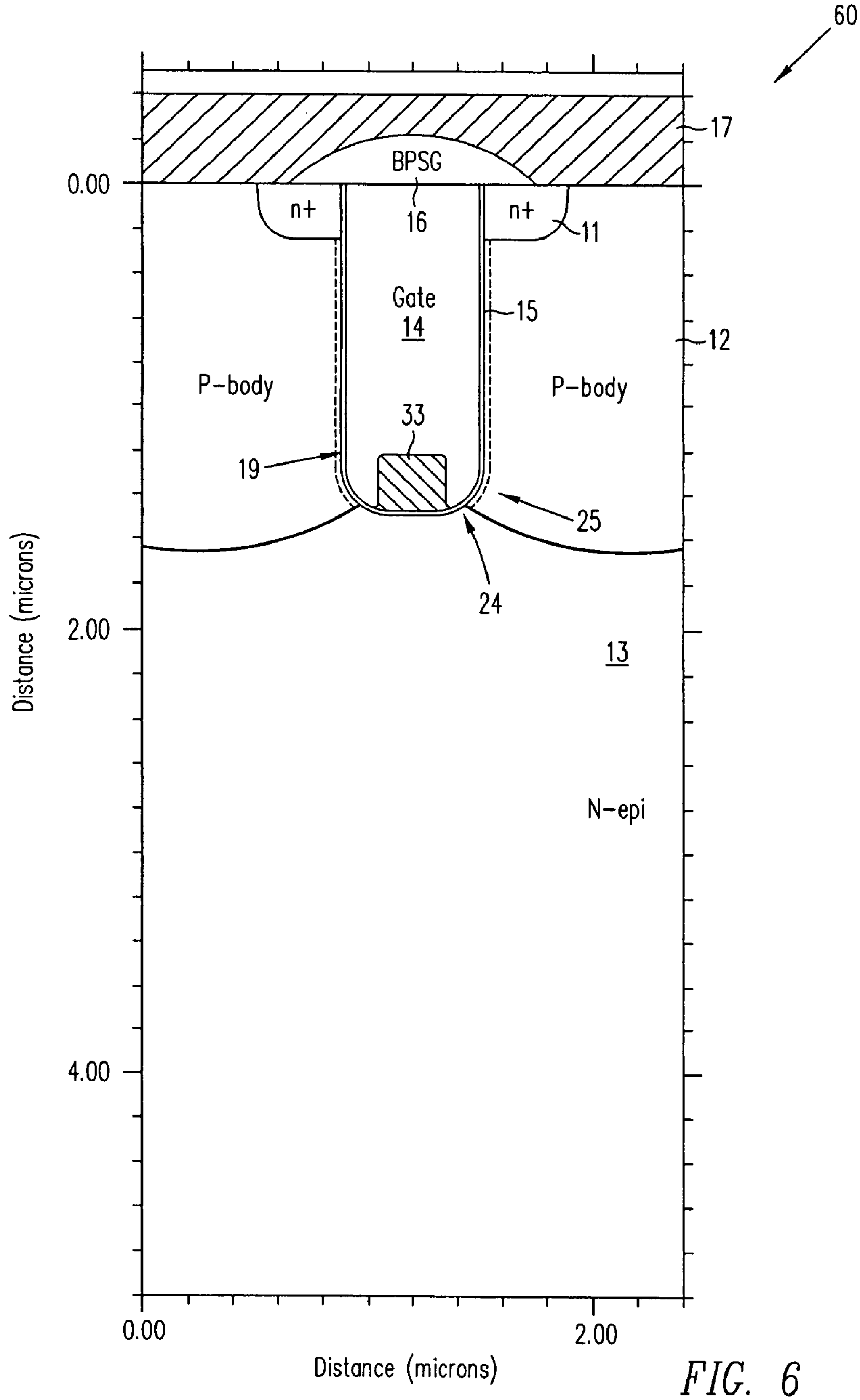
FIG. 6 is a cross-sectional view of an alternative embodiment of a trench MOSFET in accordance with the present invention.

FIG. 6 is a cross-sectional view of an alternative embodiment of a trench MOSFET 60 in accordance with the present invention. MOSFET 60 has many similarities to MOSFET 40 of FIG. 4. In particular, the sidewall and corner region 25 of trench 19 are lined with thin gate insulator 15, while oxide plug 33 is centrally located in the bottom of trench 19. In FIG. 6, however, the PN junctions between body regions 12 and N-epi layer 13 are not located as near to the interface between oxide plug 33 and thin gate insulator 15 as in MOSFET 40 of FIG. 4. In fact, the location of the PN junctions between body regions 12 and N-epi layer 13 can vary. As discussed above with reference to FIG. 5M, body regions 412 are formed using known implantation and diffusion techniques. The structure of MOSFET 60 of FIG. 6 can be fabricated by varying the diffusion conditions associated with the diffusion of body regions 12 so that diffusion stops before body regions 12 reach the interface of oxide plug 33.

Figure 1:
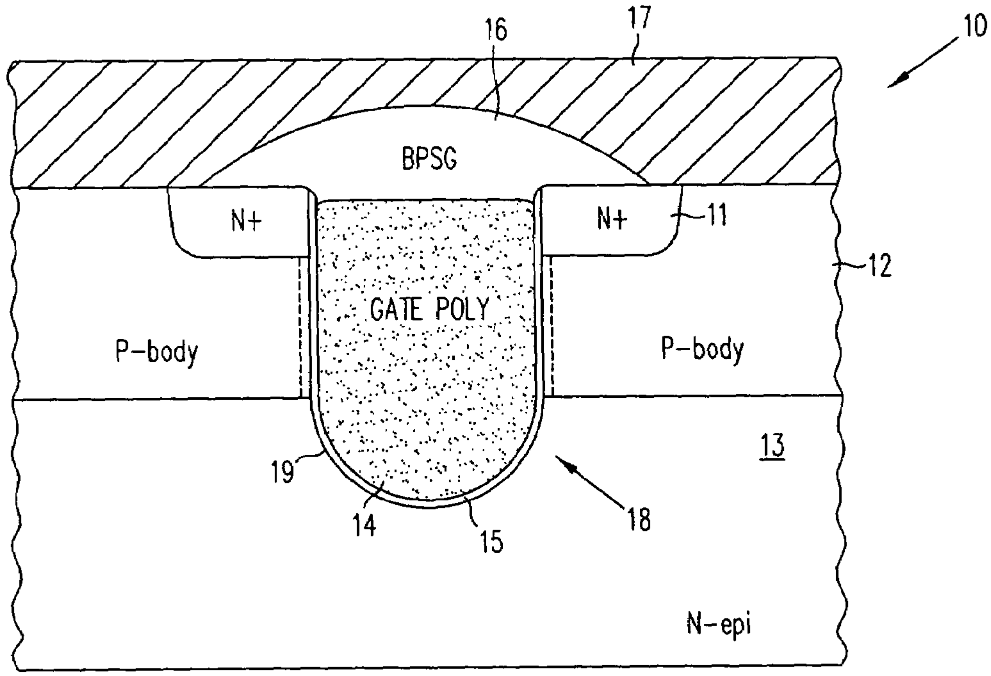
FIG. 1 is a cross-sectional view of a conventional trench MOSFET.
Figure 2:
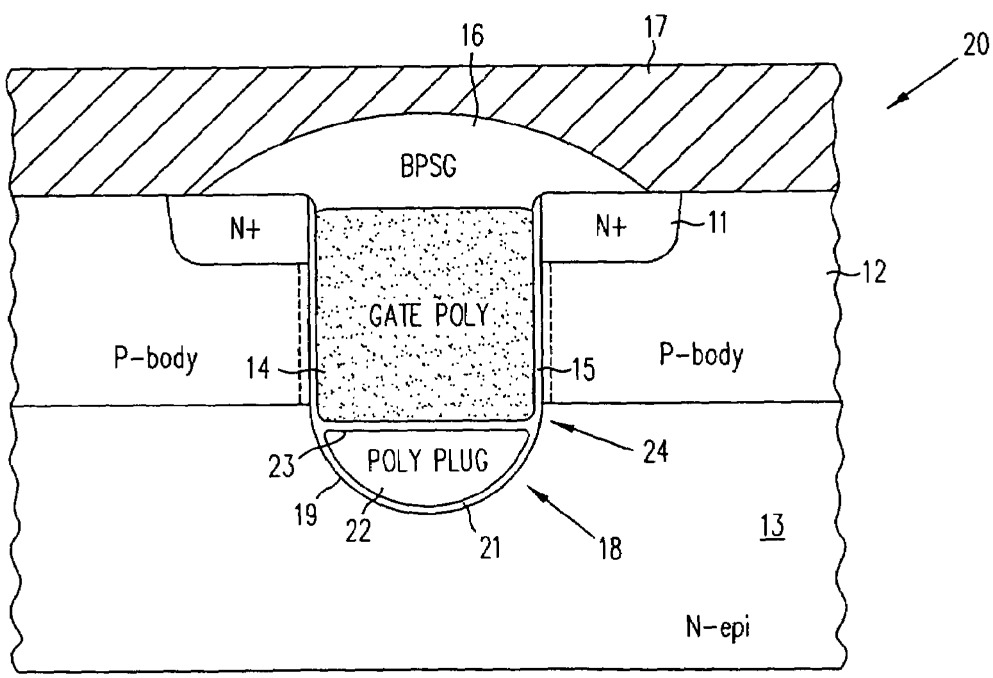
FIG. 2 is a cross-sectional view of a trench MOSFET with a polysilicon plug at the bottom of the trench.
Figure 3:
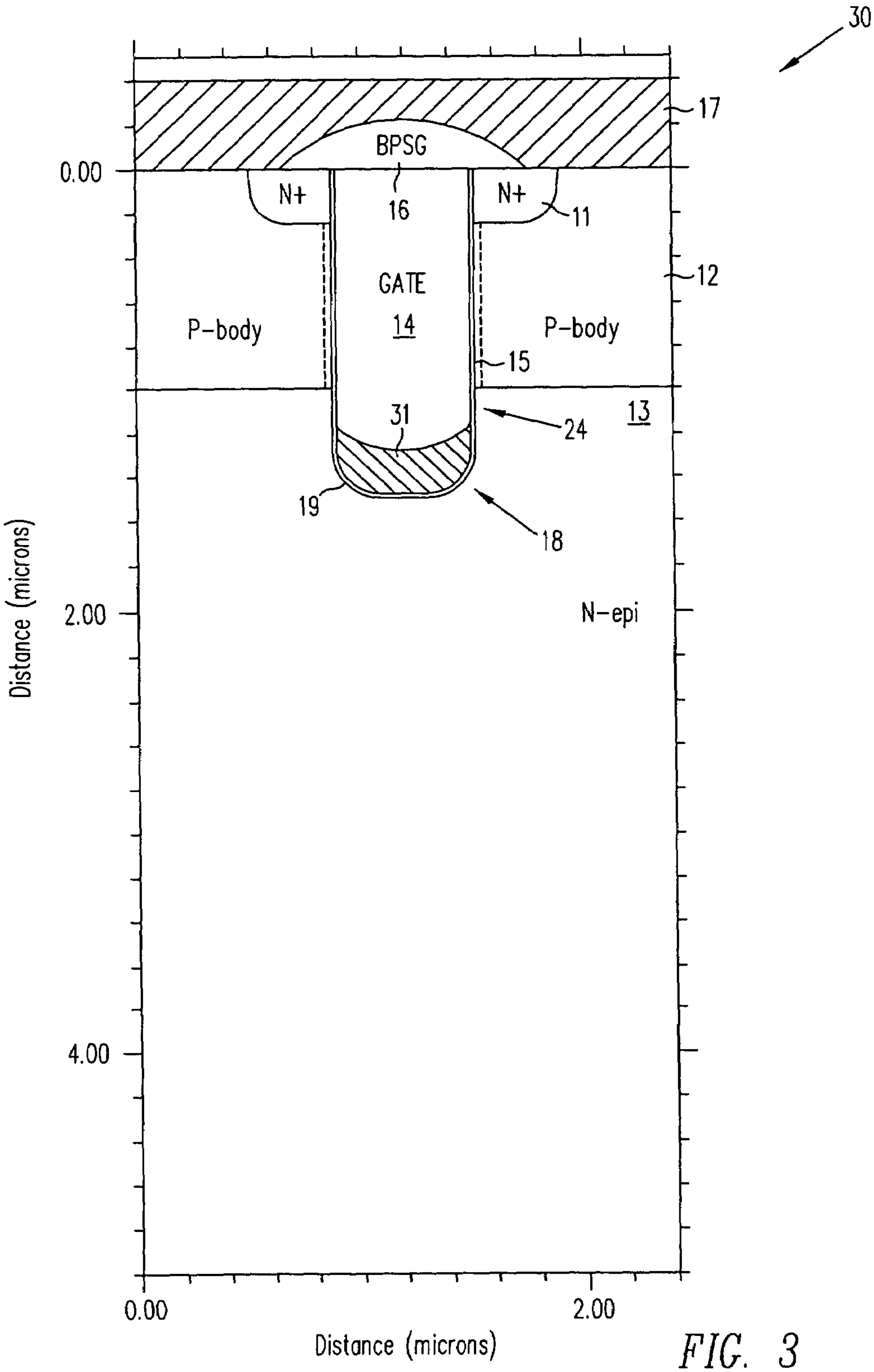
FIG. 3 is a cross-sectional view of a trench MOSFET with a thick insulating layer at the bottom of the trench.

MOSFET 60 of FIG. 6 exhibits reduced gate-to-drain capacitance, $C_{gd}$, compared to MOSFET 10 of FIG. 1, MOSFET 20 of FIG. 2, and MOSFET 30 of FIG. 3. MOSFET 10 of FIG. 1 has a large $C_{gd}$ due to thin gate insulator 15 throughout overlap region 18. MOSFET 20 of FIG. 2 and MOSFET 30 of FIG. 3 have large $C_{gd}$ due to thin gate insulator 15 throughout thin gate oxide regions 24, since regions 24 may be large due to the fast nature of vertical diffusion. The extent of thin gate oxide region 24 in MOSFET 60 of FIG. 6, however, can be minimized since the diffusion of body regions 12 in thin gate oxide region 24 will be dominated by lateral diffusion under trench 19, instead of vertical diffusion deeper into N-epi layer 13.

Figure 7:
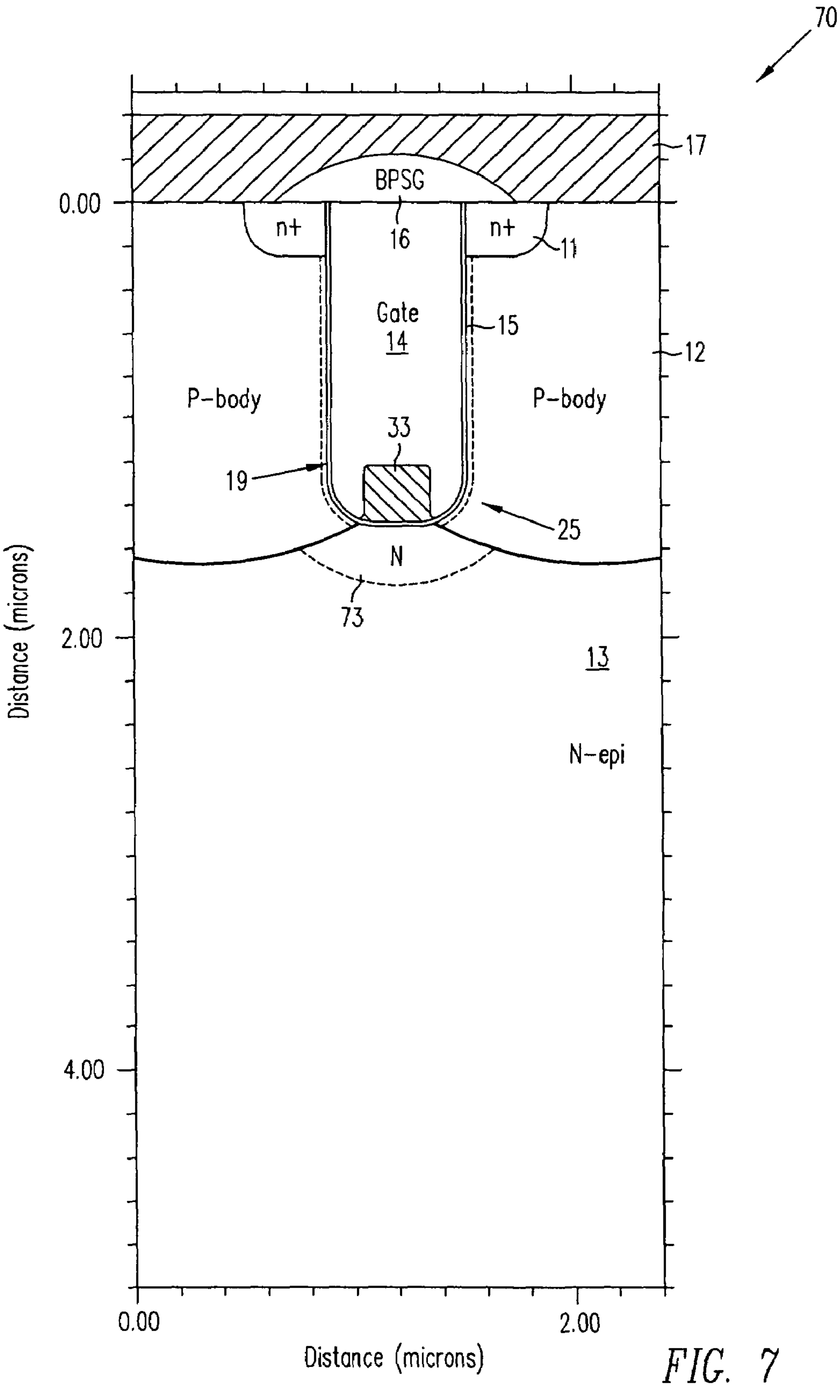
FIG. 7 is a cross-sectional view of an alternative embodiment of a trench MOSFET in accordance with the present invention.

FIG. 7 is a cross-sectional view of an alternative embodiment of a trench MOSFET 70 in accordance with the present invention. MOSFET 70 has many similarities to MOSFET 40 of FIG. 4. In particular, the sidewall and corner region 25 of trench 19 are lined with thin gate insulator 15, while oxide plug 33 is centrally located in the bottom of trench 19. In MOSFET 40 of FIG. 4, oxide plug 33 may increase the on-resistance ($R_{on}$) of MOSFET 40 due to an increase in the spreading resistance in the accumulation layer at the bottom of trench 19. MOSFET 70 of FIG. 7, however, includes a high doping region 73 at the bottom of trench 19 to help spread current more effectively and minimize pinching of body region 12. High doping region 73 also helps self-align the PN junction between p-type body regions 412 and N-epi layer 413 to the edge of thick insulating layer 433, during the diffusion process shown in FIG. 5M. Highly doped region 73 is formed in N-epi layer 13. Highly doped region 73 may be created by implanting an n-type dopant, such as arsenic or phosphorous, after trench 19 is etched as shown in FIG. 5C, after pad oxide 454 is formed as shown in FIG. 5D, or after nitride layer 456 is etched as shown in FIG. 5F. Thus, oxide plug 33 minimizes gate-to-drain capacitance, $C_{gd}$, and highly doped region 73 minimizes on-resistance, $R_{on}$ yielding a trench MOSFET 70 well-suited for high frequency applications.

As mentioned above, positioning the transition between the thick and thin sections of the gate oxide layer at the bottom of the trench is advantageous in aligning the transition with the junction between the body region and the N-epi region because the body region diffuses more slowly in a lateral direction than in a vertical direction. In another variation according to this invention, this alignment is further improved by forming a gradual transition between the thick and thin sections of the gate oxide layer.

The process may be identical to that described above through the step illustrated in FIG. 5F, where the nitride etch leaves spacers of nitride mask layer 456 along the sidewall of trench 419, while exposing pad oxide 454 in the central bottom portion of trench 419. In the next step, however, instead of depositing a thick insulating layer by, for example, CVD, a thick oxide layer is grown by a thermal process. When this is done, the thermal oxide consumes part of the silicon and thereby undercuts the edges of the nitride layer, causing the nitride layer to "lift off" of the surface of the trench. This forms a structure that is similar to the "bird's beak" in a conventional LOCOS (local oxidation of silicon) process that is often used to create field oxide regions on the top surface of a semiconductor device.

Figure 8:
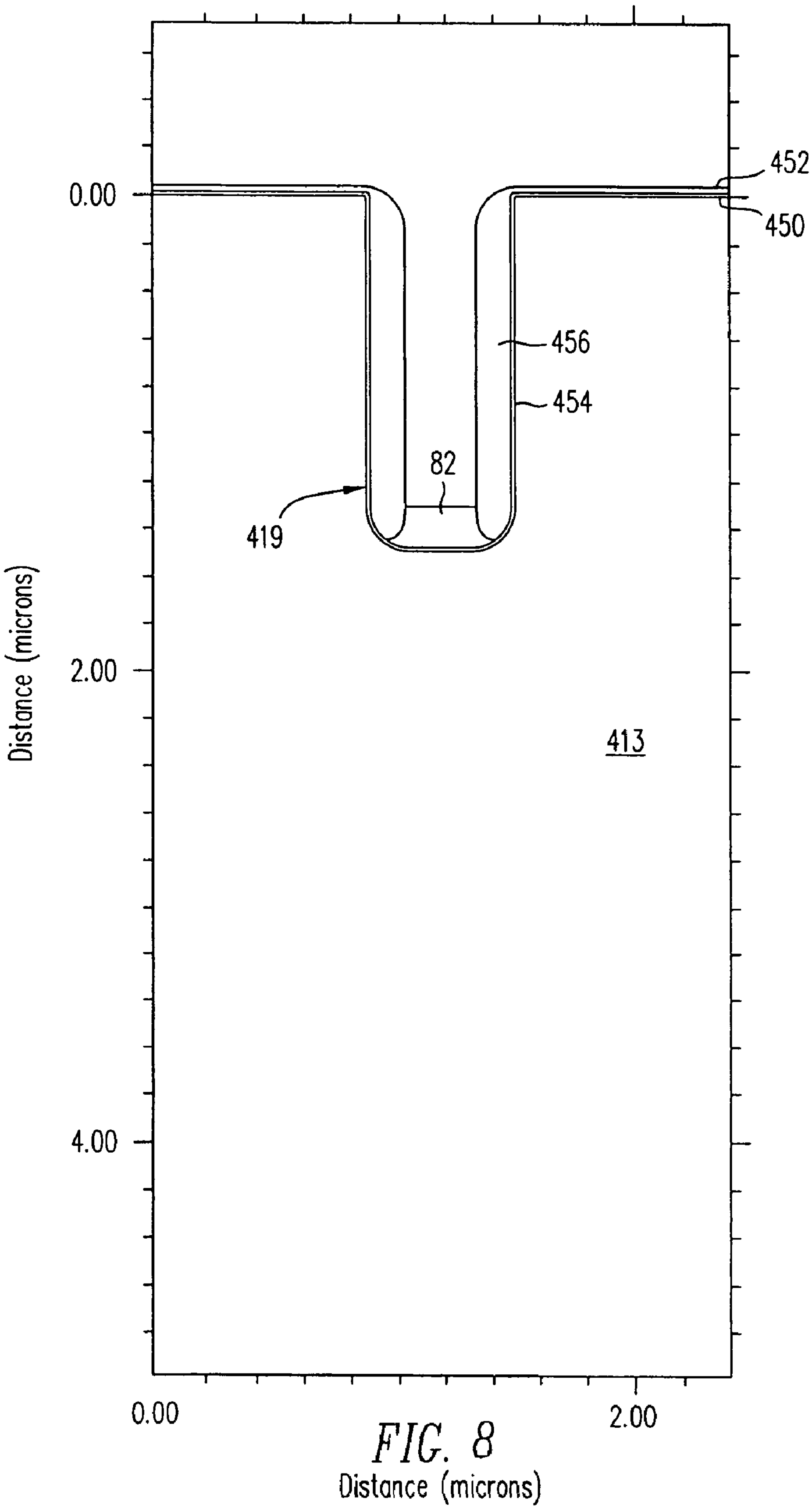
FIG. 8 is a cross-sectional view taken during the fabrication of yet another alternative embodiment

FIG. 8 shows the structure after a thermal oxide layer 82 has been grown at the bottom of trench 419. The structure is shown in detail in FIG. 9A. The edges of thermal oxide layer 82 have pushed under nitride layer 456 and as a result become sloped or tapered.

Figure 9A:
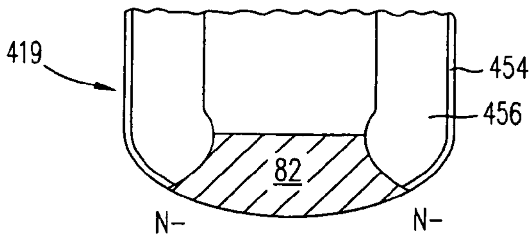
FIGS. 9A–9C show three variations of the embodiment of FIG. 8.
Figure 9B:
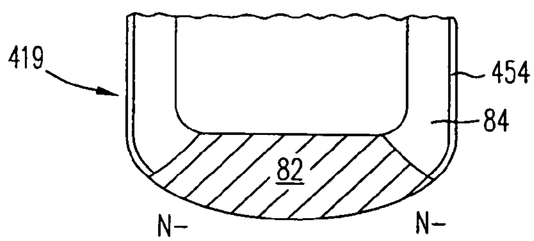
Figure 9C:
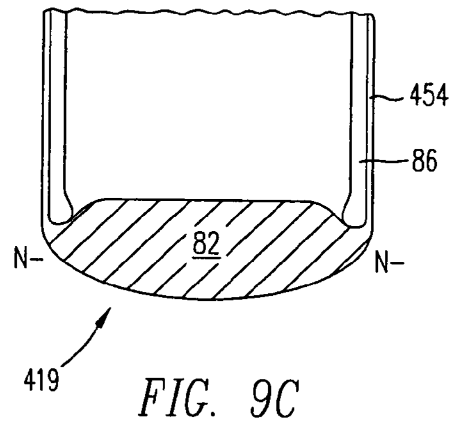

Altering the thickness of the nitride layer allows one to position the edges of the oxide layer at different locations. FIG. 9A shows a relatively thick nitride layer 456, and as a result the edges of oxide layer 82 are located on the bottom of trench 419. FIG. 9B shows a thinner nitride layer 84, with the edges of oxide layer 82 located essentially at the corners of trench 419. FIG. 9C shows an even thinner nitride layer 86 with the edges of oxide layer 82 located on the sidewalls of trench 419.

In a similar manner, the edges of the oxide layer may be positioned at various intermediate points by altering the thickness of the nitride layer. The thickness of the nitride layer is independent of the width or depth of trench 419. For example, if the nitride layer is in the range of 1,500 to 2,000 Å thick, the edges of oxide layer 82 would most likely be located on the bottom of trench 419 (FIG. 9A). If the nitride layer is 500 Å or less thick, the edges of oxide layer 82 would typically be located on the sidewalls of trench 419 (FIG. 9C).

Oxide layer 82 may be grown, for example, by heating the silicon structure at a temperature from 1,000° C. to 1,200° C. for 20 minutes to one hour.

After the thermal oxide layer has been grown, the nitride layer may be removed by etching with a nitride etchant. To ensure that all of the nitride is removed, another anneal may be performed, for example, at 1,000° C. for 5–10 minutes to oxidize any remaining nitride, and the anneal may be followed by an oxide etch. The oxide etch removes any oxidized nitride but does not remove significant portions of oxide layer 82.

A gate oxide layer may then be grown, the trench may be filled with a gate material such as polysilicon, and the other steps described above and illustrated in FIGS. 5I-5P may be performed. With reference to FIG. 5M, the diffusion of P-type dopant is controlled such that the PN junction between P-body 412 and N-epi region 413 intersects the trench somewhere within the "bird's beak" area, where the thickness of the oxide layer is gradually decreasing. Thus the PN junction does not need to be located at a particular point.

Figure 10:
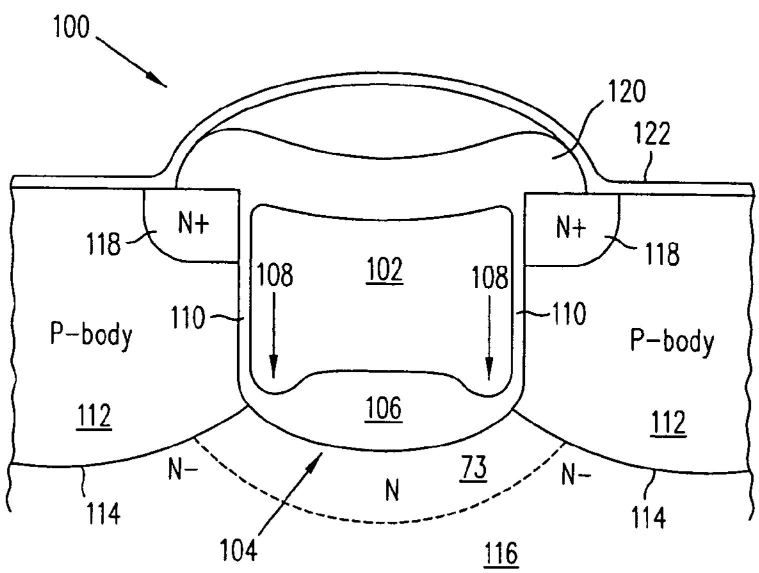
FIG. 10 is a cross-sectional view of the completed MIS device of FIG. 8.

FIG. 10 illustrates a MOSFET 100 fabricated in accordance with this embodiment of the invention. MOSFET 100 includes a gate electrode 102 that is positioned in a trench 104, which is lined with an oxide layer. The upper surface of gate electrode 102 is recessed into trench 104. The oxide layer includes a thick section 106, formed in accordance with this invention, which is located generally at the bottom of trench 104, and relatively thin sections 110 adjacent the sidewalls of trench 104. Between thick section 106 and thin sections 110 are transition regions 108, where the thickness of the oxide layer decreases gradually from thick section 106 to thin sections 110. MOSFET 100 also includes P-body regions 112, which form PN junctions 114 with an N-epi region 116. PN junctions 114 intersect trench 104 in the transition regions 108. As described above, the location of transition regions 108 can be varied by altering the thickness of the nitride layer during the fabrication of MOSFET 100.

MOSFET 100 also includes $N^+$ source regions 118, a thick oxide layer 120 overlying gate electrode 102, and a metal layer 122 that makes electrical contact with P-body regions 112 and $N^+$ source regions 118. As shown by the dashed lines, MOSFET 100 may contain a highly doped region 73 at the bottom of trench 104. Highly doped region 73 may be created by implanting an n-type dopant, such as arsenic or phosphorous, after the trench has been formed as shown in FIG. 5C, after the pad oxide has been formed as shown in FIG. 5D, or after the nitride layer has been etched as shown in FIG. 5F.

Fabricating a device in accordance with this embodiment allows a greater margin of error in the positioning of the PN junction between the P-body region and the N-epi. Compared with MOSFET 40 shown in FIG. 4, for example, the body-drain junctions do not need to be precisely positioned at the sharp edges of oxide plug 33. In addition, the breakdown characteristics of the MOSFET are enhanced because the thickness of the oxide at the trench corners can be increased without increasing the thickness of the gate oxide near the channel region and thereby raising the threshold voltage.

Figure 11A:
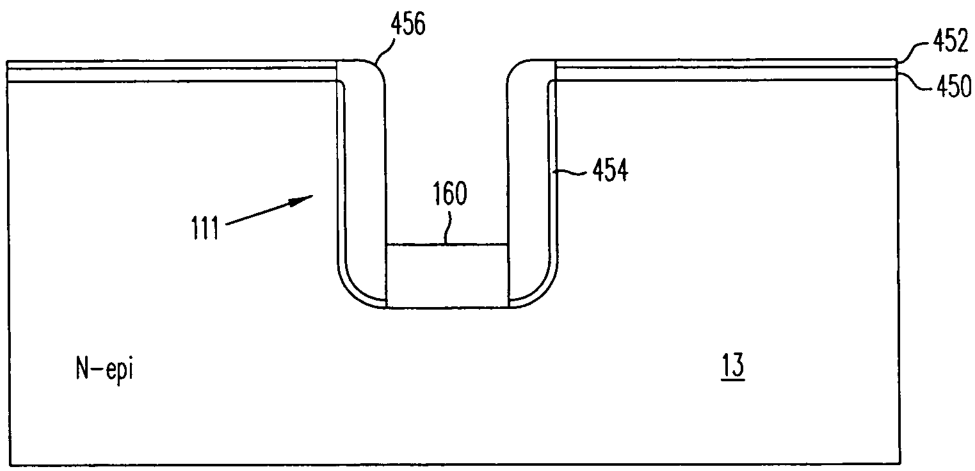
FIGS. 11A and 11B are cross-sectional views showing a process of fabricating a thick insulating plug at the bottom of the trench using a preferential deposition technique.
Figure 11B:
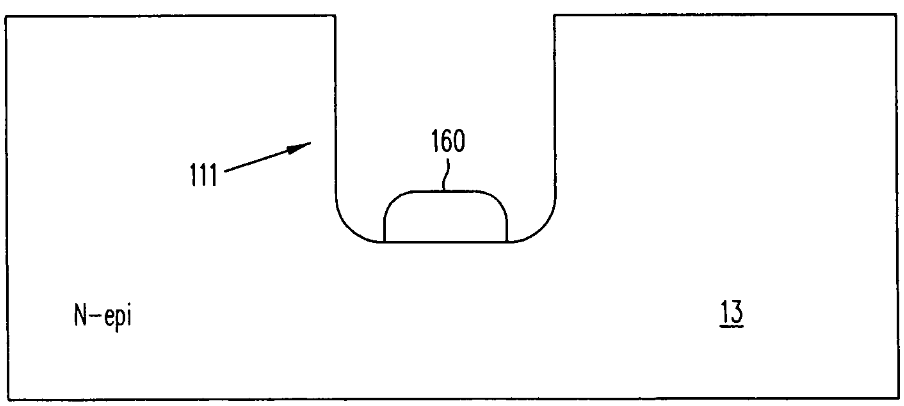

Yet another way of forming a thick bottom oxide is illustrated in FIGS. 11A and 11B. After nitride sidewall spacers 456 have been formed, as described above and shown in FIG. 5F, an oxide layer 160 is deposited by a process that causes it to deposit selectively on the silicon exposed in the bottom of trench 111 rather than on the sidewall spacers 456. One process that may be used is a sub-atmospheric chemical vapor deposition (SACVD) process, using ozone to drive the chemical reaction. During the reaction, the ozone readily dissociates to release atomic oxygen, which combines with a precursor such as TEOS to form silicon dioxide. The structure may then be annealed.

Table 1 illustrates exemplary process parameters for ozone-activated TEOS SACVD formation of thick oxide layer 160.

TABLE 1

| | |
|---|---|
| Temperature | 400° C. |
| Pressure | 600 Torr |
| Ozone flow rate | 5000 sccm |
| Helium flow rate | 4000 sccm |

TABLE 1-continued

| | |
|---|---|
| TEOS flow rate | 325 mgm |
| GDP-to-wafer spacing | 250 mm |

Spacers 456 may include materials other than nitride. The material used for the spacers is selected such that silicon dioxide preferentially deposits on silicon over the spacers. The selection of the material for the spacers depends on the oxide deposition process used. Table 2 illustrates the deposition selectivity of several materials during ozone-activated TEOS SACVD.

TABLE 2

| Material | Deposition Selectivity |
|---|---|
| Si:Nitride | 5:1 |
| Si:Thermal Oxide | 3:1 |
| Si:TEOS PECVD Oxide | 2:1 |
| Si:$SiH_4$ PECVD Oxide | 1:1 |
| Si:PECVD BPSG | 1:1 |

As shown in Table 2, during ozone-activated TEOS SACVD, silicon dioxide deposits on silicon five times faster than it deposits on nitride. Thus, during fabrication of a device using nitride sidewall spacers 456, the silicon dioxide deposited in the bottom of trench 111 would be about five times thicker than any silicon dioxide deposited on the nitride sidewall spacers 456. In fact, for 3000 Å of oxide film growth on the silicon surface, no oxide growth was observed on the nitride surface. The deposition selectivity is possibly due to the lower surface energy of silicon nitride compared to silicon. As illustrated in Table 2, thermally grown silicon dioxide or TEOS PECVD deposited silicon dioxide may also make a suitable material for the spacers when the deposition of layer 160 is ozone-activated TEOS SACVD, since silicon dioxide will also preferentially deposit on silicon over these materials. $SiH_4$ PECVD deposited silicon dioxide or PECVD deposited BPSG would not make suitable spacer materials for ozone-activated TEOS SACVD, since silicon dioxide does not prefer silicon to these materials. If a deposition process besides ozone-activated TEOS SACVD is used, materials other than those shown in Table 2 may be used for the sidewall spacers.

After oxide layer 160 has been deposited, a buffered oxide etch is used to remove any oxide that deposited on the surfaces of nitride sidewall spacers 456, and a wet nitride etch is used to remove nitride sidewall spacers 456 and nitride layer 452. To ensure that all of the nitride is removed, another anneal may be performed, for example, at 1,000° C. for 5–10 minutes to oxidize any remaining nitride, and the anneal may be followed by an oxide etch. The oxide etch removes any oxidized nitride but does not remove significant portions of oxide layer 160.

Pad oxide 450 is also removed, typically by a wet etch. This wet etch removes a small but insignificant portion of oxide layer 160. The resulting structure is shown in FIG. 11B, with a portion of oxide layer 160 left remaining at the bottom of trench 111.

The description above has generally concerned the "active" areas of an MIS device, which contain active device cells for controlling the flow of current. The techniques of this invention are also useful in the inactive areas, including the "gate bus" areas, where electrical contact between the gate bus and the conductive material in the gate trenches is typically made.

Figure 12:
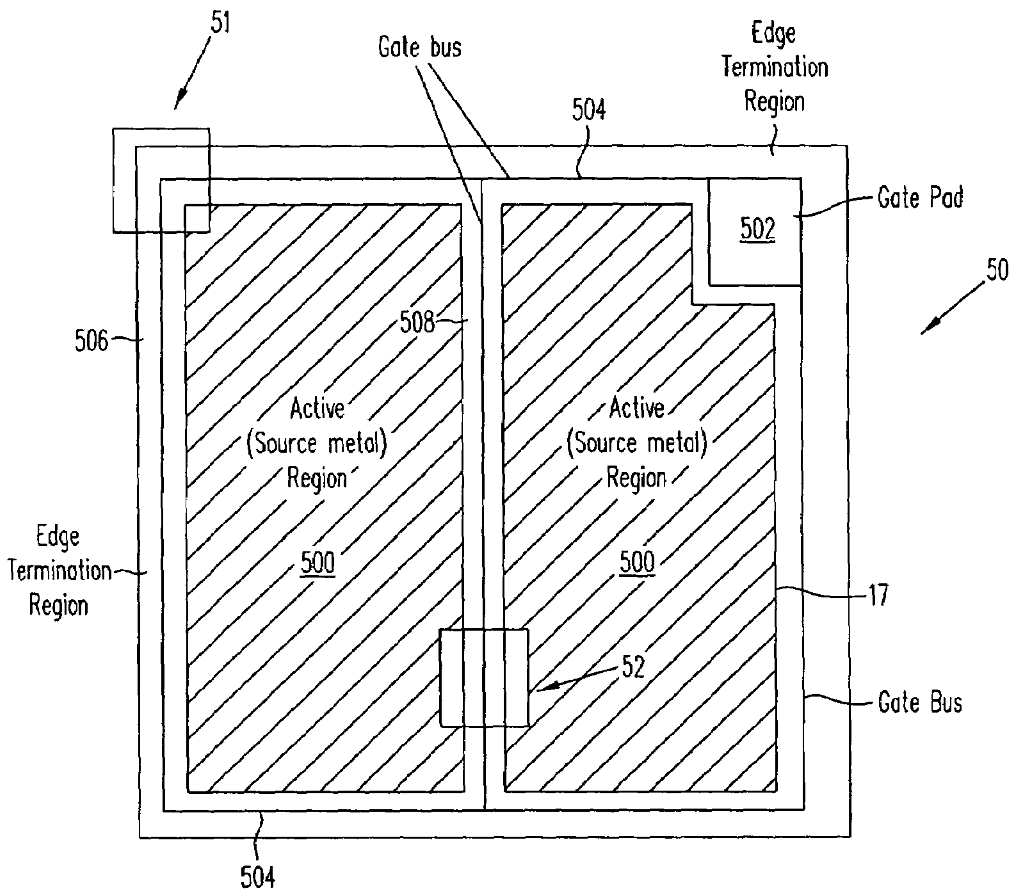
FIG. 12 shows a top view of an integrated circuit chip.
Figure 13A:
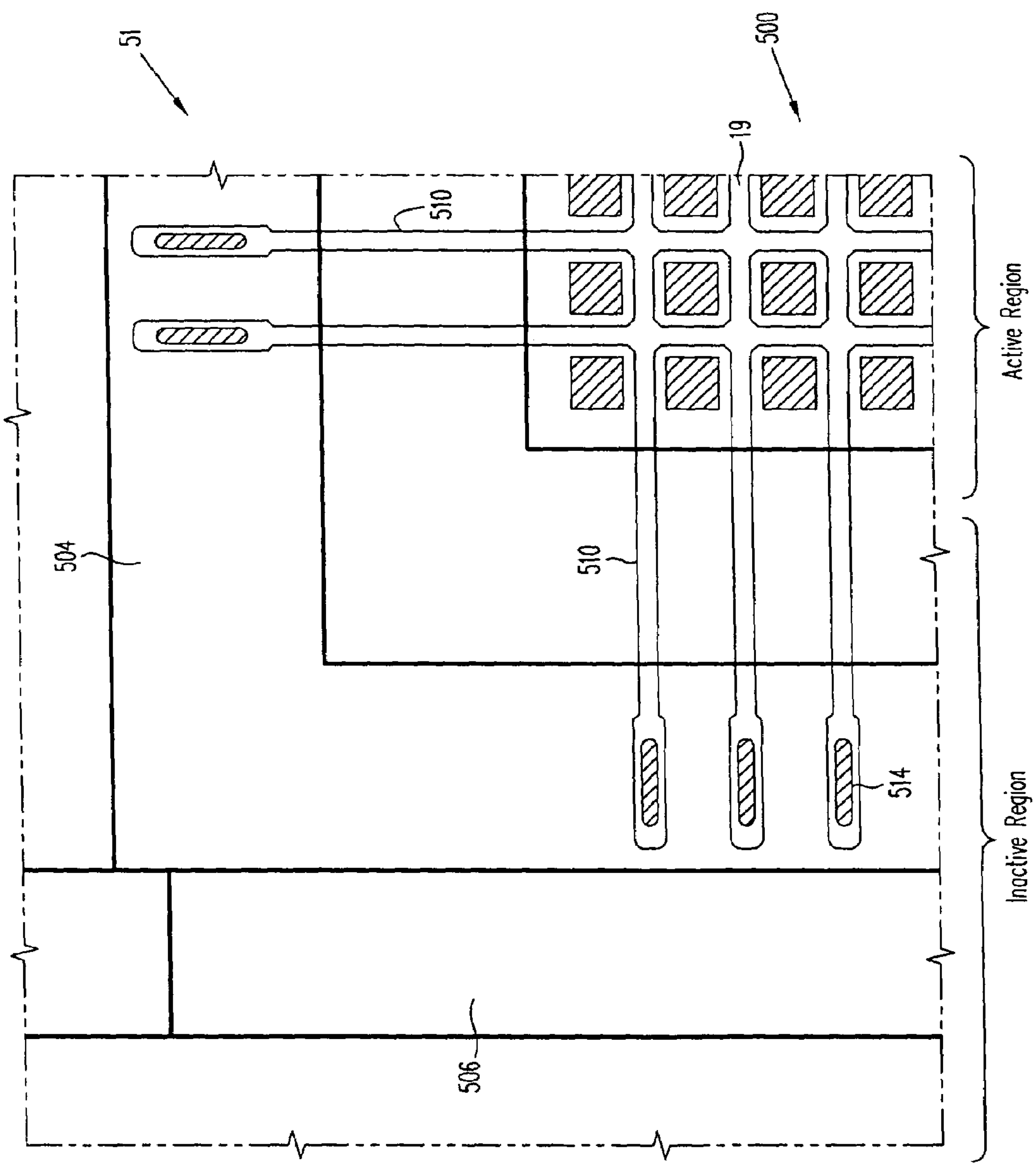
FIGS. 13A and 13B show detailed views of two portions of the gate bus area of the chip of FIG. 12.
Figure 13B:
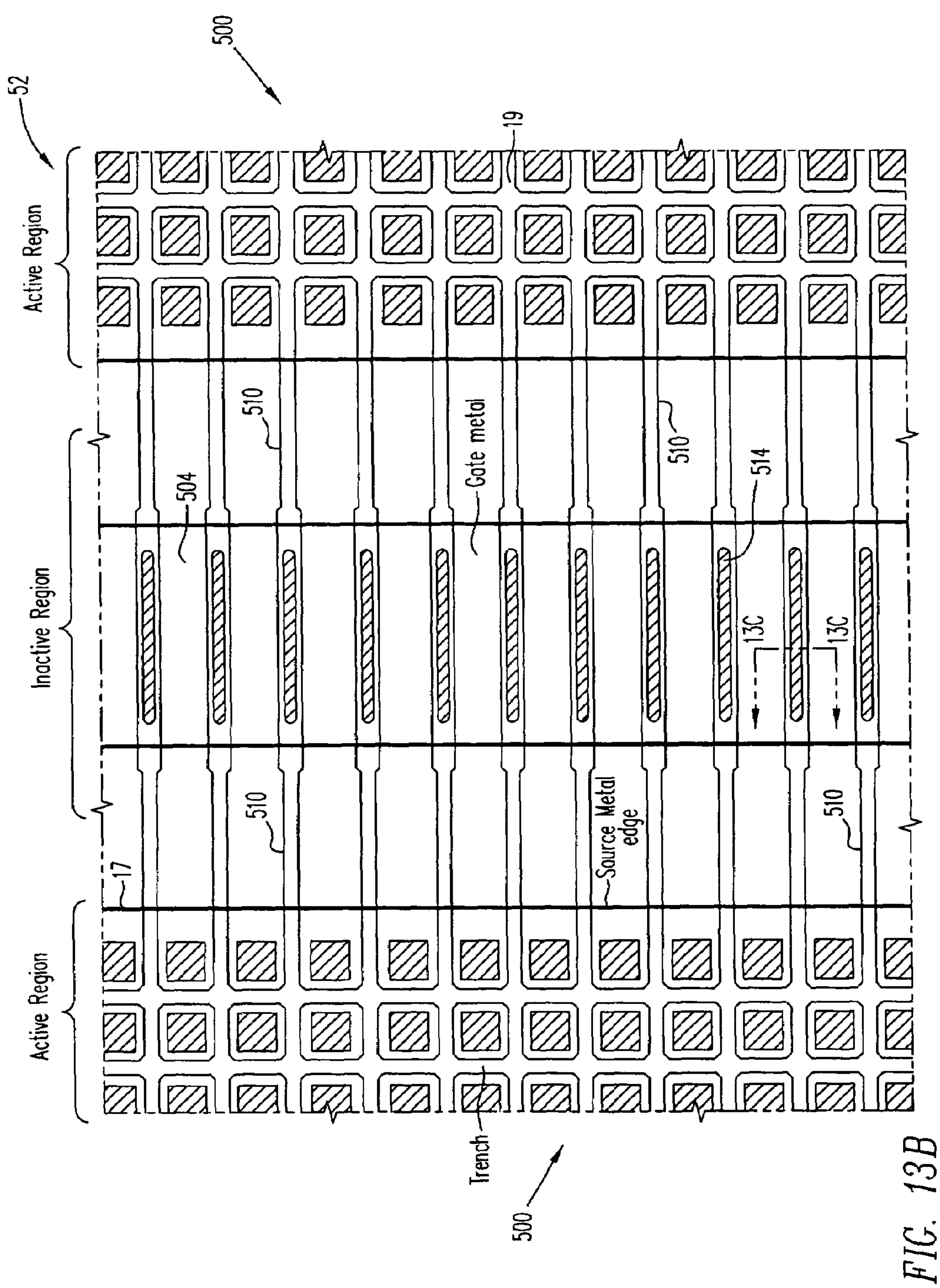

FIG. 12 illustrates a general top view of an MIS chip 50 showing the active regions 500 and an edge termination region 506. Also shown are a gate pad 502 and a gate bus 504. Gate bus 504 lies partially in edge termination region 506. It will be appreciated by those skilled in the art that numerous alternative configurations are possible. FIGS. 13A and 13B are detailed views of areas 51 and 52, respectively, in FIG. 12. Area 51 is located at a corner of chip 50, and area 52 is located in the interior of chip 50 where gate bus 504 runs between active regions 500.

Figure 13C:
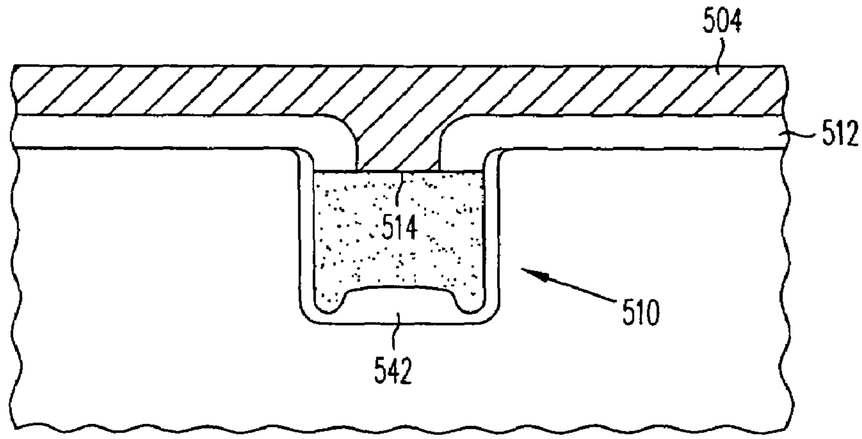
FIG. 13C is a cross-sectional view of the gate contact in the chip of FIGS. 13A–13B.

As shown in FIGS. 13A and 13B, active regions 500 contain a lattice of trenches 19 which define square MOSFET cells. Source metal layer 17 overlies active regions 500 and As shown in FIGS. 13A and 13B, active regions 500 contain a lattice of trenches 19 which define square MOSFET cells. Source metal layer 17 overlies active regions 500 and makes contact with the source and body regions in each of the cells, as shown in FIG. 4, for example. A series of parallel gate fingers 510, which are essentially extensions of trenches 19, extend from active regions 500 to locations below gate bus 504, which is in an inactive region. FIG. 13 C is a cross-sectional view taken at section 13C—13C in FIG. 13B, showing how electrical contact is made between gate bus 504 and the polysilicon gate material within one of gate fingers 510 through an opening in a BPSG (borophosphosilicate glass) layer 512. The area of contact between gate bus 504 and the polysilicon gate material is designated 514 in FIGS. 13A–13C. Gate fingers 510 become slightly wider under gate bus 504 to allow a larger contact area 514. It should be noted that the method of contacting the polysilicon gate material shown in FIG. 13C is illustrative and not limiting. As those of skill in the art will know, there are alternative ways of making contact between the gate bus and the gate electrode.

Figure 14C:
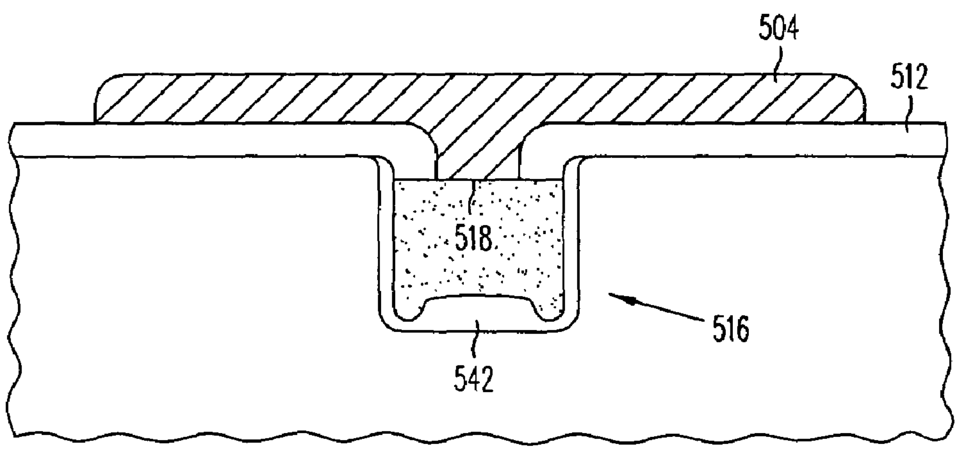
FIG. 14C is a cross-sectional view of the gate contact in the chip of FIGS. 14A–14B.
Figure 14A:
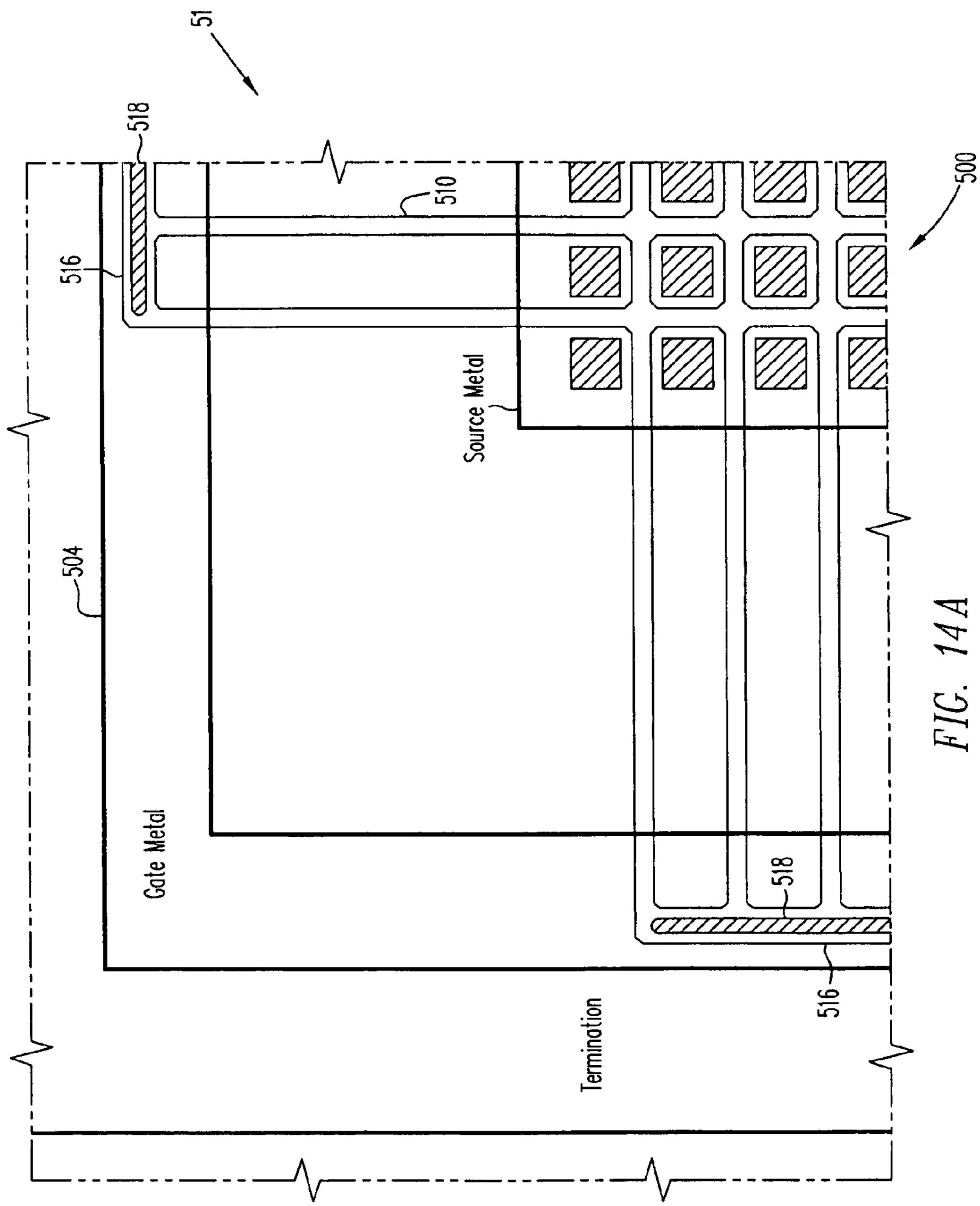
FIGS. 14A and 14B show detailed views of an alternative layout of the gate bus area in the chip of FIG. 12.
Figure 14B:
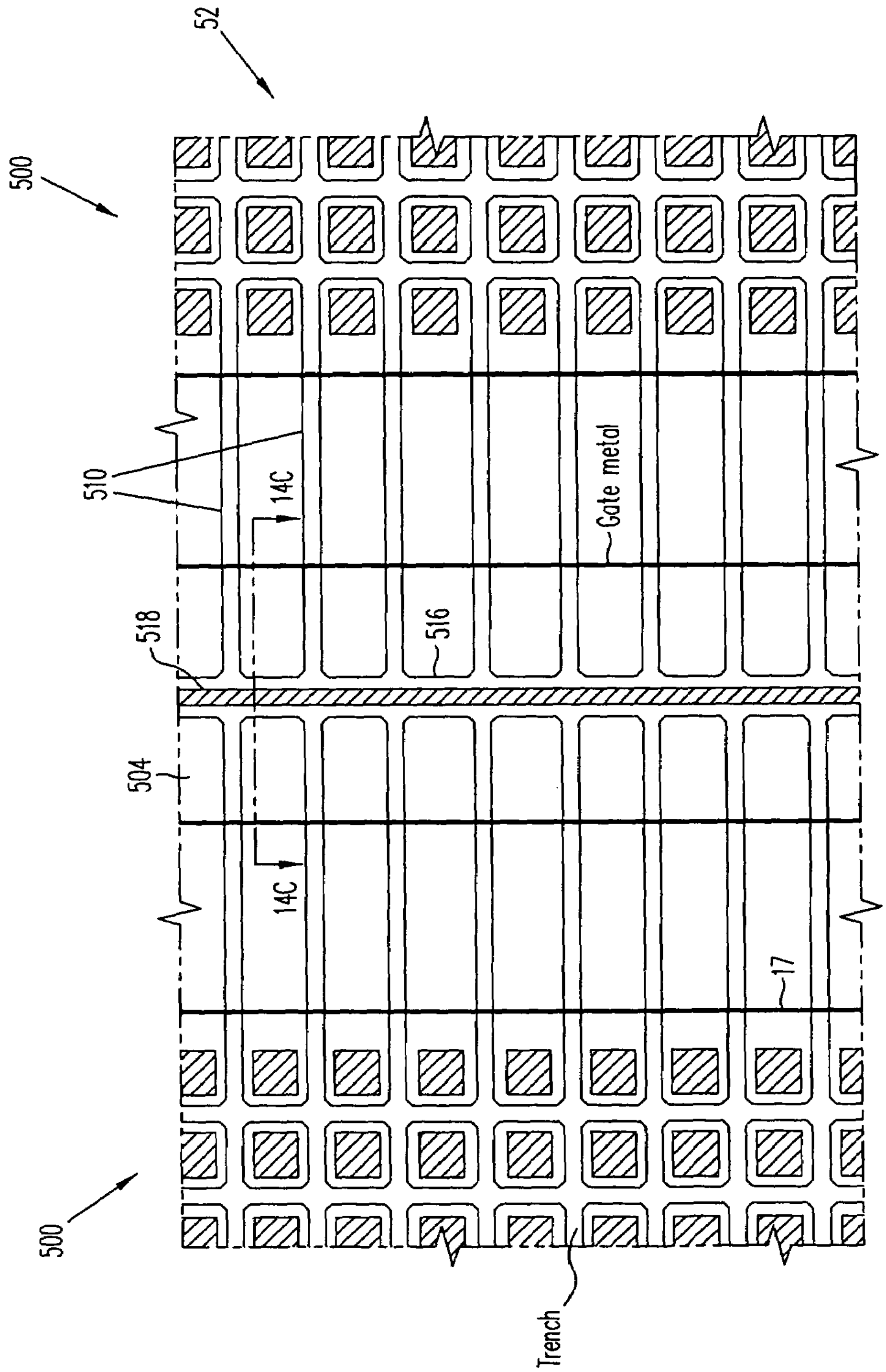

FIGS. 14A–14C, 15A–15B, 16 and 17 illustrate alternative layouts for contacting the gate electrode. In FIGS. 14A–14C, gate fingers 510 intersect a transverse gate finger 516, which extends perpendicular to gate fingers 510. In this embodiment, gate finger 516 is slightly wider than gate fingers 510, but this need not be the case. The areas of contact 518 between gate bus 504 and the polysilicon in gate finger 516 run parallel to gate fingers 516 and are shown in FIG. 14C, which is taken at cross-section 14C—14C in FIG. 14B.

Figure 15A:
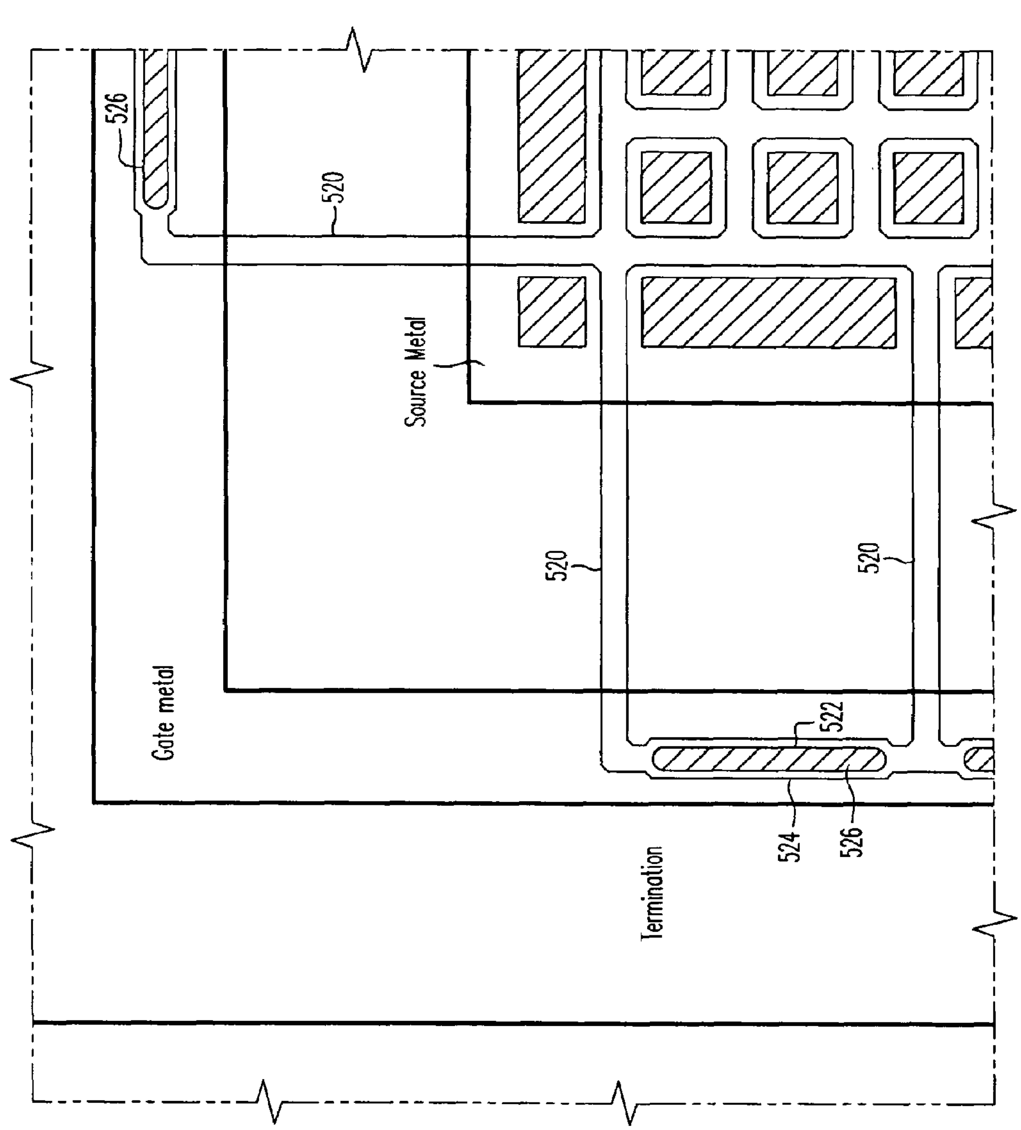
FIGS. 15A and 15B show detailed views of another alternative layout of the gate bus area in the chip of FIG. 12.
Figure 15B:
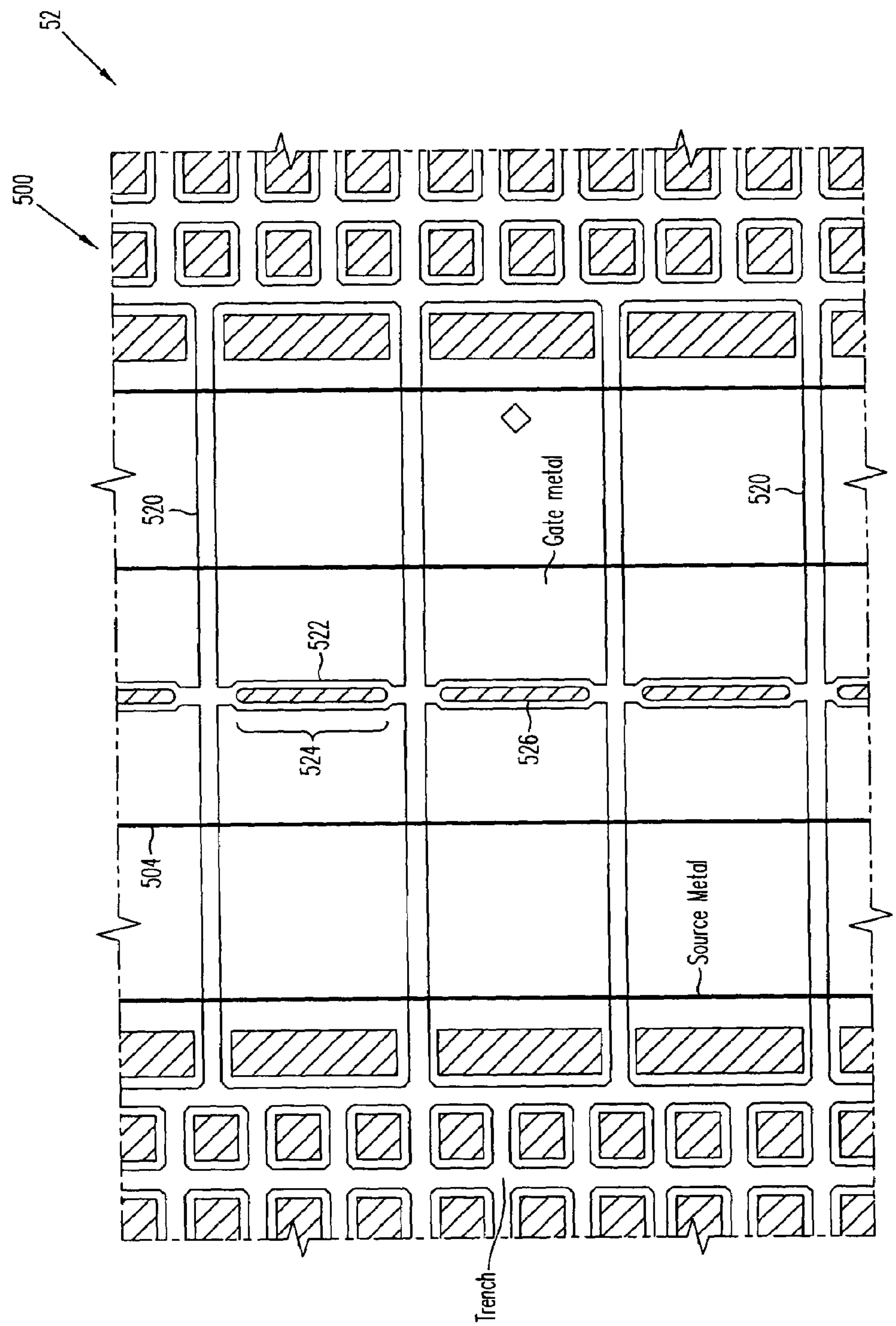

The embodiment shown in FIGS. 15A–15B is somewhat similar to the embodiment shown in FIGS. 14A–14C, except that gate fingers 520 are more widely spaced than gate fingers 510 and transverse gate finger 522 has wider segments 524 between the intersections with gate fingers 520. The contacts 526 between gate bus 504 and the polysilicon in gate finger 522 are made in the wider segments 524. This increases the area available for making the contacts while avoiding the problems that may occur in filling the trenches at the intersections between gate fingers 520 and 522 if gate finger 522 is wider than gate fingers 520 (as in embodiment shown in FIGS. 14A–14C).

Figure 16:
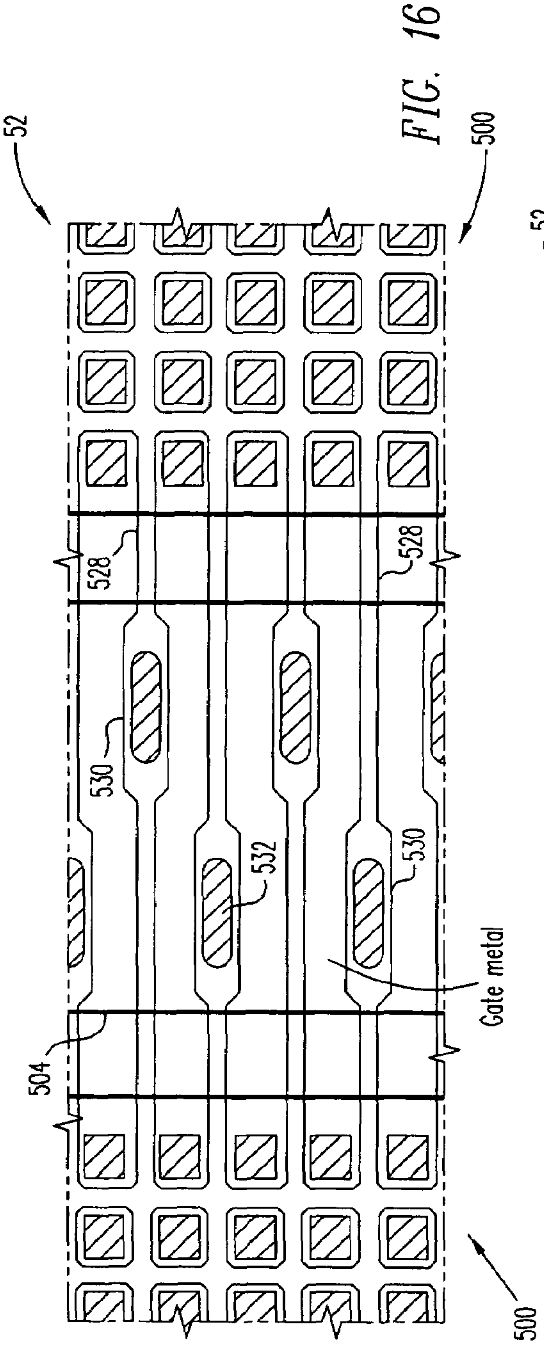
FIGS. 16 and 17 show detailed views of other alternative layouts of the gate bus area in the chip of FIG. 12.
Figure 17:
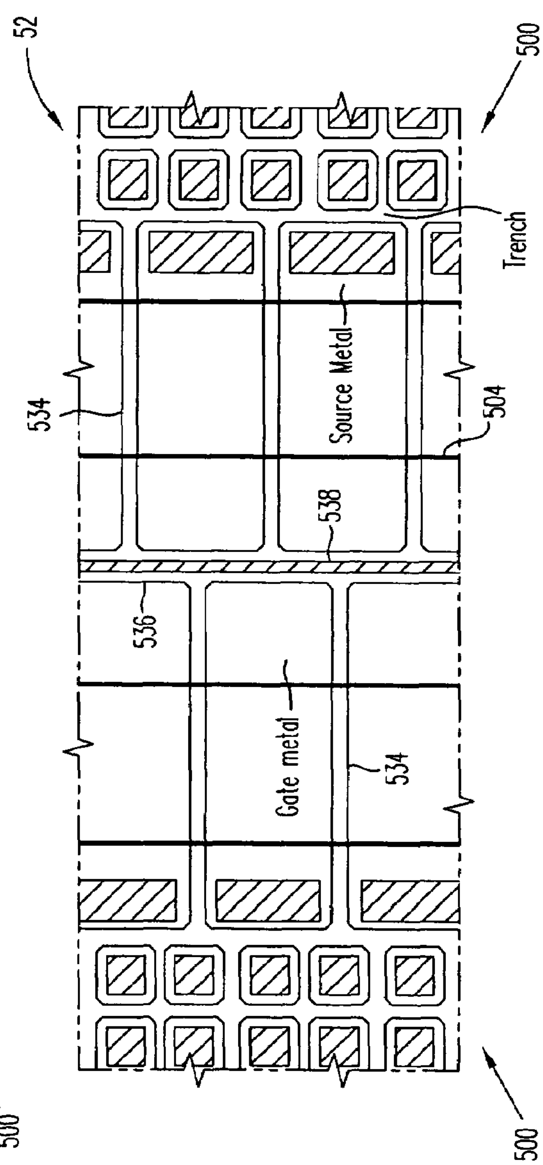

The embodiment shown in FIG. 16 is similar to the embodiment shown in FIGS. 13A–13C, except that the wider segments 530 in adjacent gate fingers 528 are offset with respect to each other so as to permit a significantly wider segment for contacts 532 between gate bus 504 and the polysilicon in gate fingers 528. The embodiment shown in FIG. 17 is similar to the embodiment of FIGS. 15A and 15B except that the intersections between transverse gate finger 536 and the gate fingers 534 that extend from the active region 500 on one side of gate bus 504 are spaced between the intersections between transverse gate finger 536 and the gate fingers 534 that extend from the active region 500 on the other side of gate bus 504. This can alleviate problems in filling the trench at the intersections between gate fingers 520 and transverse gate finger 522 in the embodiment of FIGS. 15A and 15B.

Referring again to the cross-sectional views of FIGS. 13C and 14C, it will be seen that the oxide layer 540 that lines gate fingers 510 and 516 has a plug portion 542 at the bottom of the trench. Plug portion 542 can be formed by any of the processes described above and it helps to minimize the capacitance between the gate and the drain in the inactive areas of the chip. Preferably, whichever process is used, plug portion 542 is formed simultaneously with the thick trench bottom layers in the active areas of the chip, as shown, for example, in FIGS. 5H, 8 and 11A.

The foregoing embodiments are intended to be illustrative and not limiting of the broad principles of this invention. Many additional embodiments will be apparent to persons skilled in the art. For example, the structures and methods of this invention can be used with any type of metal-insulator-semiconductor (MIS) device in which it is desirable to form an insulating layer between a trench gate and a region outside the trench, while minimizing the gate-to-drain overlap regions. Also, various insulating or conductive materials can be used where appropriate, and the invention is also applicable to p-type MOSFETs. The invention is limited only by the following claims.

I claim:

1. A trench MIS device formed in a semiconductor substrate and comprising and active region and an inactive region, said active region comprising:
- a first trench containing a first conductive gate material;
- a source region in said substrate; and
- a body region adjacent a side wall of said trench, said trench being lined with a thin insulating layer adjacent said body region;

said inactive region comprising:
- a second trench containing a second conductive material, said second conductive material being in electrical contact with said first conductive material;
- a relatively thin insulating layer on a side wall of said second trench;
- a relatively thick insulating layer on a bottom of said second trench; and
- a gate bus in contact with said second conductive material.

2. The trench MIS device of claim 1 wherein said relatively thin insulating layer covers a corner region between said bottom and said side wall of said second trench.

3. The trench MIS device of claim 1 comprising a transition region between said relatively thick insulating layer and said relatively thin insulating layer, said transition region comprising a graduated insulating layer abutting said relatively thick and relatively thin insulating layers, a thickness of said graduated insulating layer decreasing gradually in the direction from said relatively thick insulating layer towards said relatively thin insulating layer.

* * * * *